United States Patent
Yasuda et al.

(10) Patent No.: US 8,848,440 B2
(45) Date of Patent: Sep. 30, 2014

(54) NONVOLATILE SEMICONDUCTOR MEMORY DEVICE

(71) Applicant: Kabushiki Kaisha Toshiba, Minato-ku (JP)

(72) Inventors: Naoki Yasuda, Yokkaichi (JP); Masaru Kito, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/951,942

(22) Filed: Jul. 26, 2013

(65) Prior Publication Data

US 2014/0029343 A1    Jan. 30, 2014

(30) Foreign Application Priority Data

Jul. 26, 2012 (JP) .................................. 2012-165637

(51) Int. Cl.
  *G11C 16/04* (2006.01)
  *G11C 16/34* (2006.01)
  *G11C 11/56* (2006.01)
  *G11C 16/10* (2006.01)

(52) U.S. Cl.
  CPC ............ *G11C 16/10* (2013.01); *G11C 2213/75* (2013.01); *G11C 16/3431* (2013.01); *G11C 11/5628* (2013.01)
  USPC ............. 365/185.03; 365/185.24; 365/185.28

(58) Field of Classification Search
  USPC .................................................. 365/185.03
  See application file for complete search history.

(56) References Cited

U.S. PATENT DOCUMENTS

| | | | | |
|---|---|---|---|---|
| 7,606,070 | B2* | 10/2009 | Mokhlesi | 365/185.17 |
| 7,609,558 | B2* | 10/2009 | Hosono | 365/185.23 |
| 7,855,913 | B2* | 12/2010 | Fernandes | 365/185.03 |
| 7,916,547 | B2* | 3/2011 | Hosono | 365/185.21 |
| 2011/0002172 | A1 | 1/2011 | Kito et al. | |
| 2011/0051527 | A1 | 3/2011 | Kirisawa et al. | |
| 2011/0063914 | A1 | 3/2011 | Mikajiri et al. | |
| 2011/0188307 | A1 | 8/2011 | Kito et al. | |
| 2011/0194357 | A1 | 8/2011 | Han et al. | |
| 2011/0216604 | A1 | 9/2011 | Mikajiri et al. | |
| 2012/0195119 | A1* | 8/2012 | Nagadomi et al. | 365/185.03 |

FOREIGN PATENT DOCUMENTS

| | | |
|---|---|---|
| JP | 2006-216107 | 8/2006 |
| JP | 2011-014817 | 1/2011 |
| JP | 2011-054234 | 3/2011 |
| JP | 2011-066110 | 3/2011 |
| JP | 2011-159364 | 8/2011 |
| JP | 2011-165308 | 8/2011 |
| JP | 2011-187110 | 9/2011 |

* cited by examiner

*Primary Examiner* — Son Mai
(74) *Attorney, Agent, or Firm* — Oblon, Spivak, McClelland, Maier & Neustadt, L.L.P.

(57) ABSTRACT

According to one embodiment, a nonvolatile semiconductor memory device comprises a memory cell array including memory cell transistors configured to store information in accordance with n (n is an integer larger than 2) threshold voltage levels, and a control circuit configured to control the memory cell array. In a write operation, the control circuit shifts a threshold voltage level of a write target memory cell transistor to a base threshold level of the n threshold levels, except for a threshold level having a highest voltage and a threshold level having a lowest voltage. Then the control circuit shifts the threshold voltage level of the write target memory cell transistor from the base threshold level to one of the n threshold levels.

20 Claims, 17 Drawing Sheets

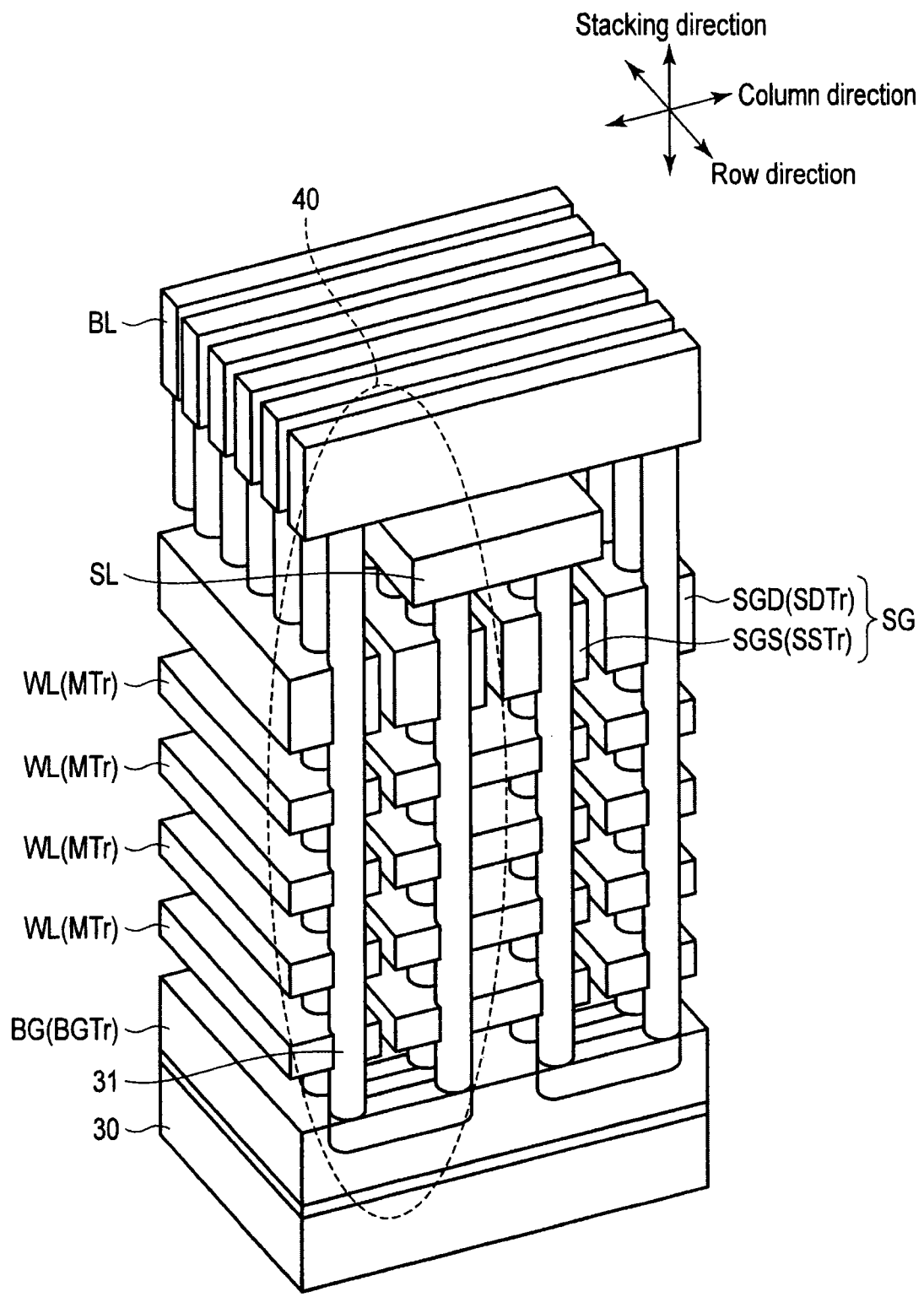
F I G. 5

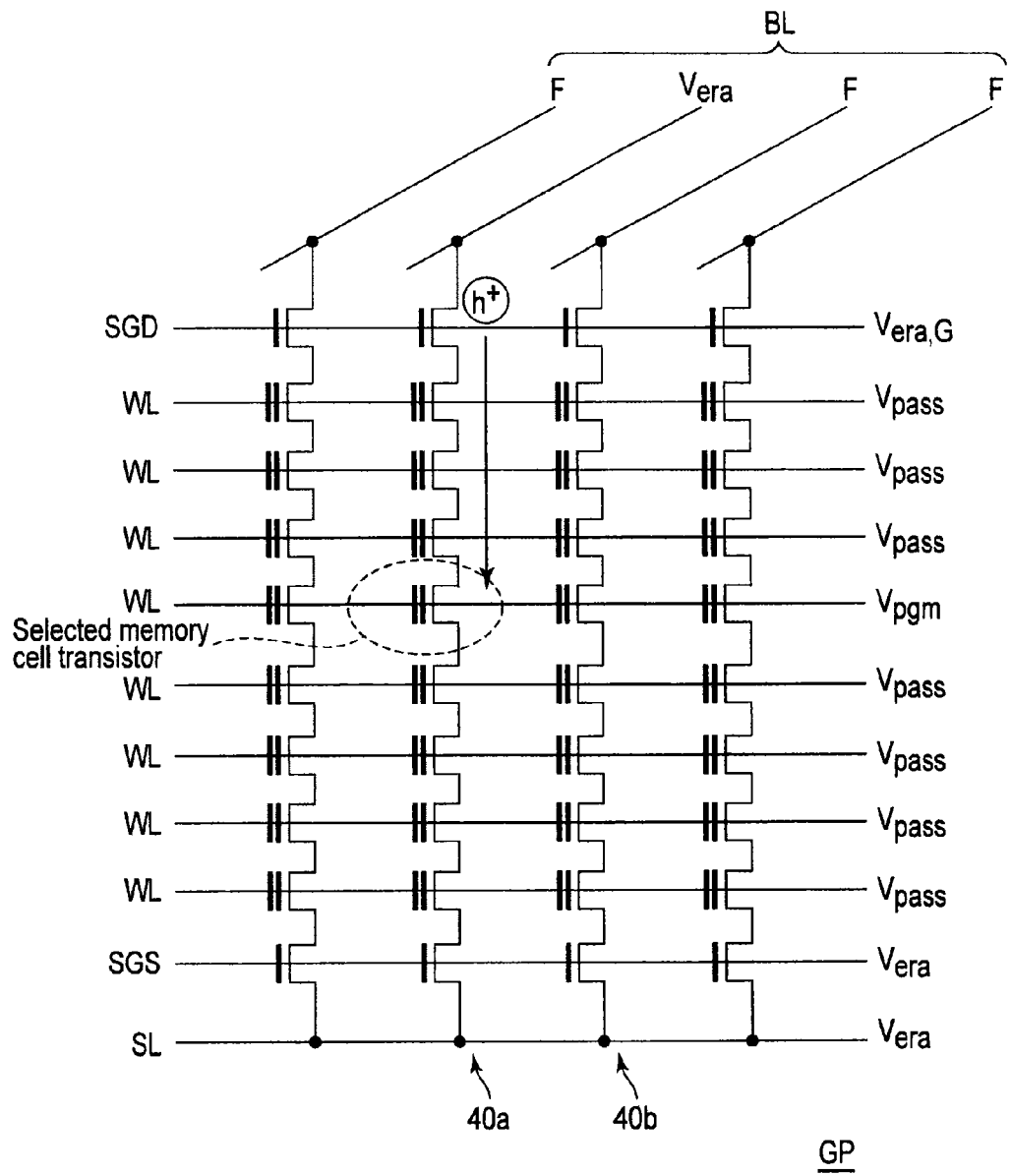
F I G. 11

NONVOLATILE SEMICONDUCTOR MEMORY DEVICE

CROSS-REFERENCE TO RELATED APPLICATIONS

This application is based upon and claims the benefit of priority from Japanese Patent Application No. 2012-165637, filed Jul. 26, 2012, the entire contents of which are incorporated herein by reference.

FIELD

Embodiments described herein relate generally to a nonvolatile semiconductor memory device.

BACKGROUND

A three-dimensionally stacked memory multilayered in the vertical direction and formed by collective processing has been proposed as a NAND flash memory.

In this three-dimensionally stacked memory, a cylindrical memory hole is formed through a plurality of electrodes stacked on a semiconductor substrate at once, and a memory layer is formed on the inner wall of the memory hole. After that, a semiconductor layer is formed inside the hole. Consequently, a memory string (NAND string) including a plurality of MONOS memory cells connected in series in the stacking direction can be formed at once.

The MONOS structure of the three-dimensionally stacked memory is formed by stacking insulating layers in order from the outside of the memory hole. In this case, a tunnel insulating film is an oxide film formed by not thermal oxidation but deposition. An oxide film formed by deposition has more defects than those of an oxide film formed by thermal oxidation. When a write/erase operation is repeated, therefore, electric charge is trapped in the tunnel insulating layer, and the charge retention characteristic deteriorates. This deterioration becomes significant when a large electric field is applied to the tunnel insulating layer.

In conventional multilevel write, a base threshold level at which write is started is a lower-end (most negative) level of multiple threshold levels. When writing data from this lower-end base threshold level to an upper-end threshold level, a large electric field is applied to the tunnel insulating layer. Consequently, electric charge trapping to the tunnel insulating layer is promoted, and the charge retention characteristic of the memory cell deteriorates.

As described above, in the three-dimensionally stacked memory in which the tunnel insulating layer must be formed by deposition, it is necessary to reduce the electric field to be applied to the tunnel insulating layer especially in a write/erase operation.

BRIEF DESCRIPTION OF THE DRAWINGS

FIG. 5 is a perspective view showing a memory string according to the embodiment;

FIG. 11 is a schematic sectional circuit diagram showing a memory group GP shown in FIG. 10;

DETAILED DESCRIPTION

Figure 1:
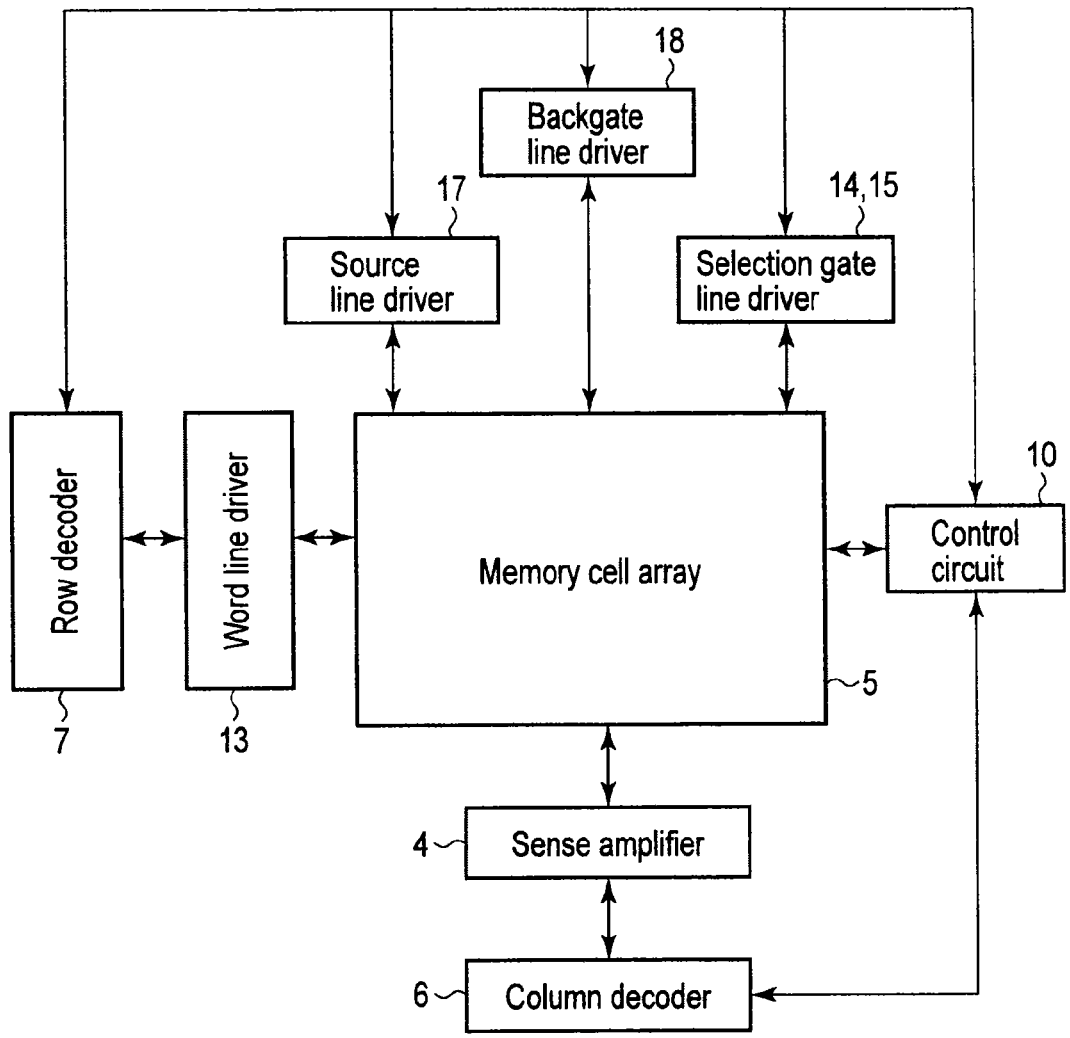
FIG. 1 is a block diagram showing an example of the overall configuration of a nonvolatile semiconductor memory device according to an embodiment.

In general, according to one embodiment, a nonvolatile semiconductor memory device comprises a memory cell array including memory cell transistors configured to store information in accordance with n (n is an integer larger than 2) threshold voltage levels; and a control circuit configured to control the memory cell array. In a write operation, the control circuit shifts a threshold voltage level of a write target memory cell transistor to a base threshold level of the n threshold levels which is located at a voltage except for a threshold level having a highest voltage and a threshold level having a lowest voltage. Then the control circuit shifts the threshold voltage level of the write target memory cell transistor from the base threshold level to one of the n threshold levels.

This embodiment will be explained below with reference to the accompanying drawing. In the drawing, the same reference numerals denote the same parts. Also, a repetitive explanation will be made as needed.

<Embodiment>

The nonvolatile semiconductor memory device according to the embodiment will be explained below with reference to FIGS. 1, 2, 3, 4, 5, 6, 7, 8, 9, 10, 11, 12, 13, 14, 15, 16, 17, 18, and 19. In this embodiment, in a memory cell for storing multilevel information, a base threshold level at which write is started is set at a nearly intermediate threshold level of a plurality of threshold levels. This makes it possible to reduce a shift amount (change amount) of the threshold voltage in a write/erase operation, thereby improving the charge retention characteristic. The nonvolatile semiconductor memory device according to the embodiment will be explained in detail below.

[Overall Configuration Example]

An example of the overall configuration of the nonvolatile semiconductor memory device according to the embodiment will be explained with reference to FIG. 1. This embodiment will be explained by taking, as an example of a three-dimensionally stacked memory, a structure in which memory strings are formed along U-shaped semiconductor layers 31, and bit lines BL and source lines SL are formed in the upper portion. However, the embodiment is not limited to this structure. This embodiment is also applicable to a three-dimensionally stacked memory having a structure in which memory strings are formed along I-shaped semiconductor layers, bit lines BL is formed in the upper portion and source lines SL is formed in the upper portion.

FIG. 1 is a block diagram showing the overall configuration example of the nonvolatile semiconductor memory device according to this embodiment.

As shown in FIG. 1, the nonvolatile semiconductor memory device includes a control circuit 10, a sense amplifier 4, a memory cell array 5, a column decoder 6, a row decoder 7, a word line driver 13, selection gate line drivers (a source-side selection gate line driver 14 and drain-side selection gate line driver 15), a source line driver 17, and a backgate line driver 18.

The memory cell array 5 includes a plurality of blocks BLK. Each of the plurality of blocks BLK includes a plurality of word lines WL, a plurality of bit lines BL, and a plurality of memory strings 40 arranged in a matrix.

In a write operation, read operation, and erase operation, the control circuit 10 generates and controls voltages to be applied to memory cells in the memory cell array 5, and controls the column decoder 6, row decoder 7, selection gate line drivers 14 and 15, source line driver 17, and backgate line driver 18 in accordance with external commands.

In a write operation, read operation, and erase operation, the column decoder 6 selects a bit line BL under the control of the control circuit 10.

The sense amplifier 4 is connected to the column decoder 6. In a write operation, read operation, and erase operation, the sense amplifier 4 applies voltages to bit lines BL selected and not selected by the column decoder 6. Note that the sense amplifier 4 may also be integrated with the column decoder 6.

In a write operation, read operation, and erase operation, the row decoder 7 selects a word line WL under the control of the control circuit 10.

The word line driver 13 is connected to the row decoder 7. In a write operation, read operation, and erase operation, the word line driver 13 applies voltages to word lines WL selected and not selected by the row decoder 7. Note that the word line driver 13 may also be integrated with the row decoder 7.

In a write operation, read operation, and erase operation, the selection gate line driver applies a voltage to a selection gate SG under the control of the control circuit 10.

In a write operation, read operation, and erase operation, the source line driver 17 applies a voltage to a source line SL under the control of the control circuit 10.

In a write operation, read operation, and erase operation, the backgate line driver 18 applies a voltage to a backgate BG under the control of the control circuit 10.

Figure 2:
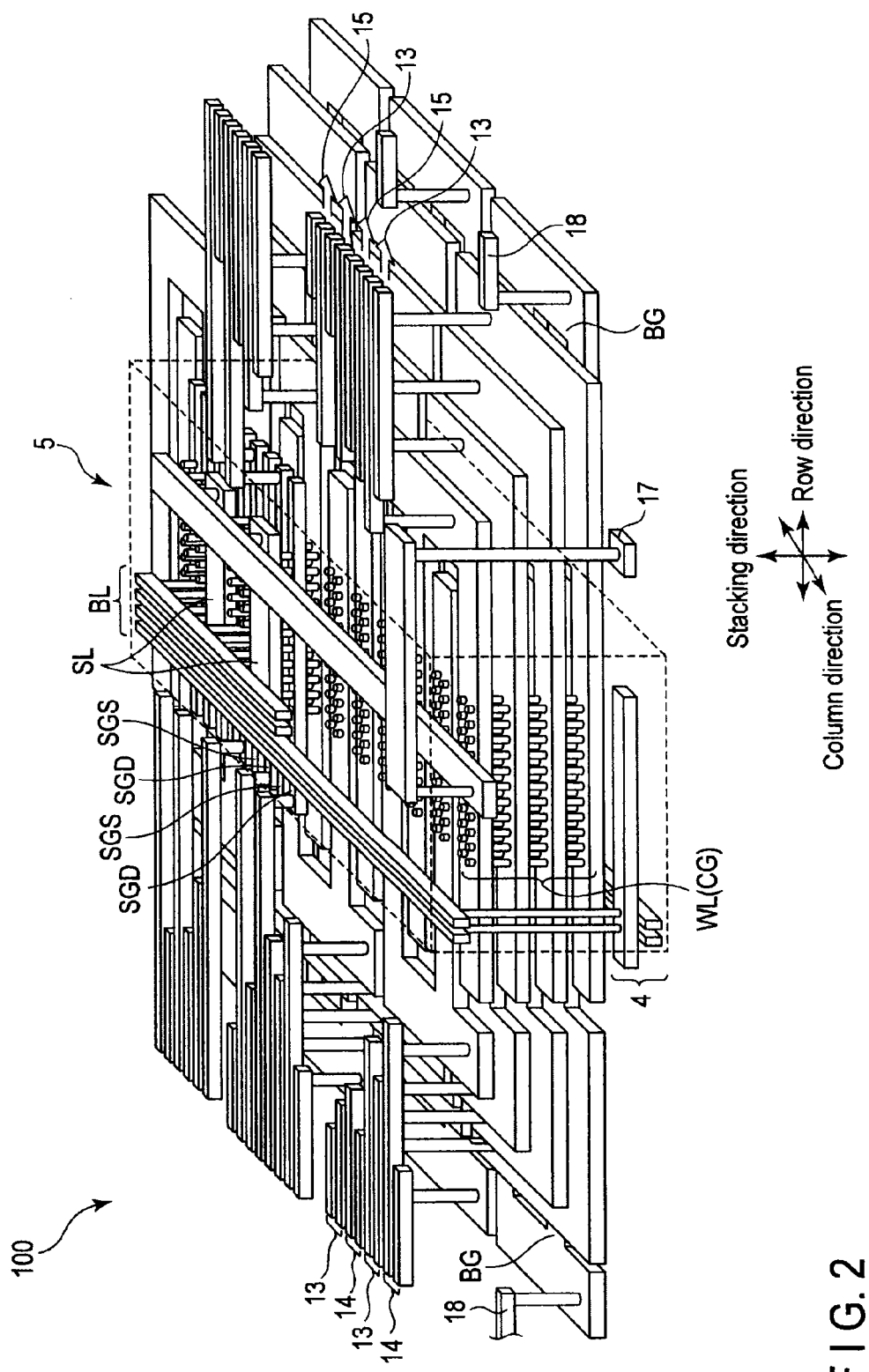
FIG. 2 is a perspective view showing the overall configuration example of the nonvolatile semiconductor memory device according to the embodiment.

FIG. 2 is a perspective view showing the overall configuration example of the nonvolatile semiconductor memory device according to this embodiment.

As shown in FIG. 2, the memory cell array 5 includes a plurality of word lines WL (control gates CG), a plurality of bit lines BL, a plurality of source lines SL, a plurality of backgates BG, a plurality of source-side selection gates SGS, and a plurality of drain-side selection gates SGD.

In the memory cell array 5, memory cell transistors MTr (to be simply referred to as memory cells in some cases hereinafter) for storing data are arranged at the intersections of the plurality of stacked word lines WL and U-shaped semiconductor layers 31 (to be described later).

The end portions of the plurality of stacked word lines WL in the row direction form a stepped shape, and a contact is connected to the upper surface of each step. The upper portions of these contacts are connected to interconnections. In the column direction, even-numbered control gates CG are connected to each other at one end in the row direction, and odd-numbered control gates CG are connected to each other at the other end in the row direction. Note that FIG. 2 shows an example in which four layers of the word lines WL are stacked, but the present embodiment is not limited to this.

Also, contacts are connected to the upper surfaces of the end portions of the source lines SL, backgates BG, source-side selection gates SGS, and drain-side selection gates SGD in the row direction. Interconnections are connected to the upper portions of the contacts.

The word line driver 13 is connected to the word lines WL via the interconnections formed in the upper portions and the contacts.

The source-side selection gate line driver 14 is connected to the source-side selection gates SGS via the interconnections formed in the upper portions and the contacts.

The drain-side selection gate line driver 15 is connected to the drain-side selection gates SGD via the interconnections formed in the upper portions and the contacts.

The backgate driver 18 is connected to the backgates BG via the interconnections formed in the upper portions and the contacts.

A plurality of source line drivers 17 are connected to the source lines SL via the interconnections formed in the upper portions and the contacts. The source line drivers 17 are each connected to a predetermined number of source lines SL, and are independently controlled by the control circuit 10.

The sense amplifier 4 is connected via contacts connected to the lower ends of the end portions of the bit lines BL in the column direction.

Note that all interconnections connected to the various drivers are formed in an interconnection layer on the same level in FIG. 2, but the present embodiment is not limited to this, and these interconnections may also be formed in interconnection layers on different levels. Note also that the number of drivers is determined in accordance with the number of gates, and one driver can be connected to either one gate or a predetermined number of gates.

[Configuration Example of Memory Cell Array]

A configuration example of the memory cell array 5 according to this embodiment will be explained with reference to FIGS. 3 and 4.

Figure 3:
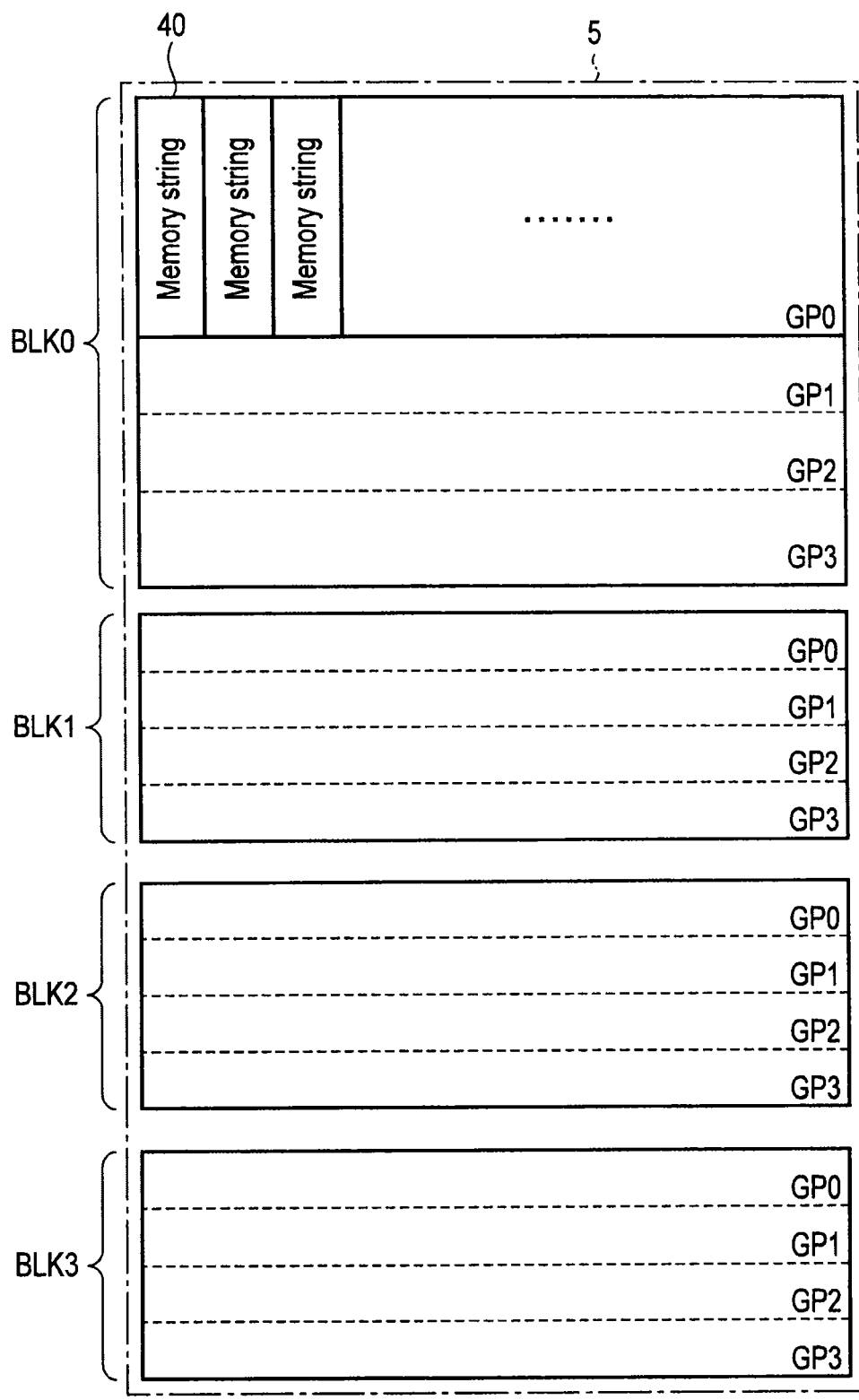
FIG. 3 is a block diagram showing a memory cell array according to the embodiment.

FIG. 3 is a block diagram showing the memory cell array 5 according to this embodiment.

As shown in FIG. 3, the memory cell array 5 includes a plurality of blocks (blocks BLK0 to BLK3). Each block BLK includes a plurality of memory groups (memory groups GP0 to GP3). Each memory group GP includes a plurality of memory strings 40. Note that in the following explanation, the blocks BLK0 to BLK3 will simply be referred to as blocks BLK when it is unnecessary to distinguish between them, and the memory groups GP0 to GP3 will simply be referred to as memory groups GP when it is unnecessary to distinguish between them.

Figure 4:
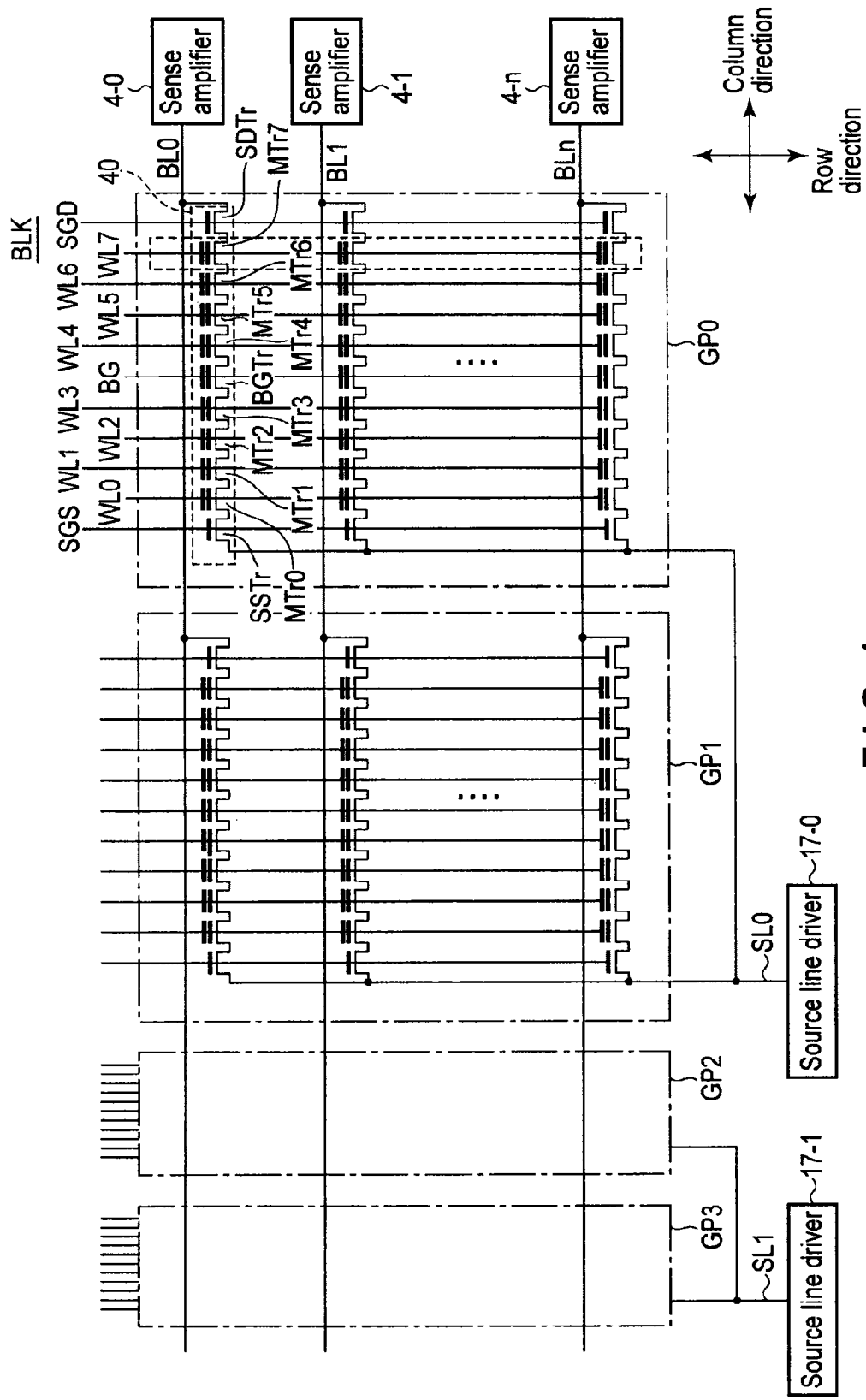
FIG. 4 is a circuit diagram showing a block according to the embodiment.

FIG. 4 is a circuit diagram showing the block BLK according to this embodiment.

As shown in FIG. 4, each block BLK includes the four memory groups GP0 to GP3 arranged in, e.g., the column direction. Each memory group GP includes n (n is a natural number) memory strings 40 arranged in the row direction.

Each memory string 40 includes, e.g., eight memory cell transistors MTr0 to MTr7, a source-side selection transistor SSTr, a drain-side selection transistor SDTr, and a backgate transistor BGTr. The current paths of the memory cell transistors MTr0 to MTr7, source-side selection transistor SSTr, drain-side selection transistor SDTr, and backgate transistor BGTr are connected in series. One terminal of the source-side selection transistor SSTr is connected to one end of this current path (in this example, to one terminal of the memory cell transistor MTr0). One terminal of the drain-side selection transistor SDTr is connected to the other end of this current path (in this example, to one terminal of the memory cell transistor MTr7). The backgate transistor BGTr is formed between the memory cell transistors MTr3 and MTr4.

Note that the number of memory cell transistors MTr is not limited to 8, and may also be, e.g., 16, 32, 64, or 128, i.e., is not restricted to any number. Note also that the current paths of the memory strings 40 are formed parallel in the column direction in FIG. 4, but they are formed parallel in the stacking direction in this embodiment as will be described later.

In the same memory group GP, the gates of the source-side selection transistors SSTr are connected together to the source-side selection gate SGS, and the gates of the drain-side selection transistors SDTr are connected together to the drain-side selection gate SGD. Also, in the same block BLK, the control gates of the memory cell transistors MTr0 to MTr7 are connected together to word lines WL0 to WL7, and the control gates of the backgate transistors BT are connected together to the backgate BG.

The word lines WL0 to WL7 and backgate BG are connected together between the plurality of memory groups GP0 to GP3 in the same block BLK, whereas the source-side selection gates SGS and drain-side selection gates SGD are independent between the memory groups GP0 to GP3 even in the same block BLK.

Of the memory strings 40 arranged in a matrix in the memory cell array 5, the other-end sides of the current paths of the drain-side selection transistors SDTr of the memory strings 40 arranged in the column direction are connected together to one of bit lines BL (BL0 to BLn, n is a natural number). That is, each bit line BL connects the memory strings 40 together between the plurality of blocks BLK. The bit lines BL0 to BLn are respectively connected to sense amplifiers 4-0 to 4-n outside the memory cell array 5. Accordingly, the voltage levels of the bit lines BL0 to BLn are independently controlled.

The other-end sides of the current paths of the source-side selection transistors SSTr in the memory group GP are connected together to the source line SL. A plurality of source lines SL (in this example, source lines SL0 and SL1) are formed in the block BLK. The source line SL0 is connected to the other-end sides of the current paths of the source-side selection transistors SSTr in the memory groups GP0 and GP1. The source line SL1 is connected the other-end sides of the current paths of the source-side selection transistors SSTr in the memory groups GP2 and GP3. That is, each source line SL connects the memory strings 40 together between two adjacent memory groups GP. The source lines SL0 and SL1 are respectively connected to source-line drivers 17-0 and 17-1 outside the memory cell array. Therefore, the voltage levels of the source lines SL0 and SL1 are independently controlled.

Note that the number of source lines SL is not limited to this and determined in accordance with the number of memory groups GP in the block BLK.

As described previously, data in the memory cell transistors MTr in the same block BLK are collectively erased. By contrast, data read or write is performed at once for a plurality of memory cell transistors MTr connected together to a given word line WL in a given memory group GP of a given block BLK. This unit will be called a "page".

[Configuration Example of Memory String]

A configuration example of the memory string 40 according to this embodiment will be explained below with reference to FIGS. 5, 6, and 7.

FIG. 5 is a perspective view showing the memory string 40 according to this embodiment. FIG. 6 is an enlarged sectional view of the memory string 40 shown in FIG. 5.

Figure 6:
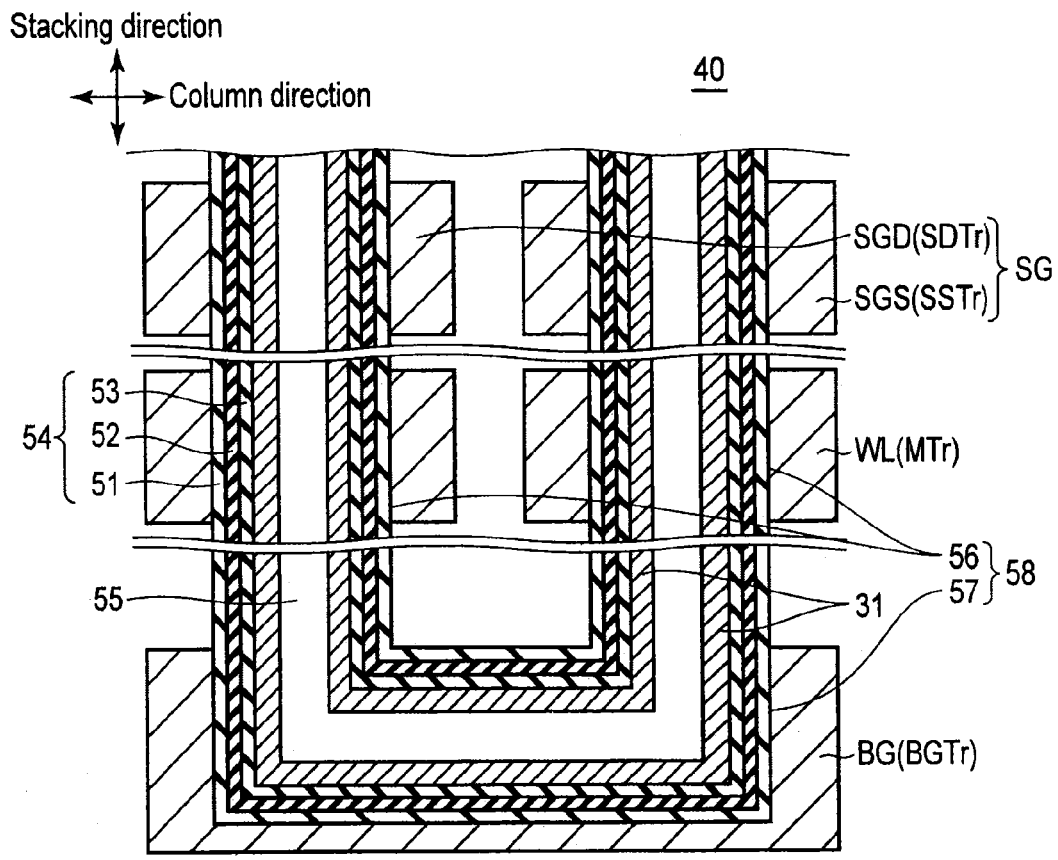
FIG. 6 is an enlarged sectional view of the memory string shown in FIG. 5.

In the memory cell array 5 as shown in FIGS. 5 and 6, the memory string 40 is formed above a semiconductor substrate 30, and includes a backgate BG, a plurality of word lines WL, a selection gate SG, a U-shaped semiconductor layer 31, and a memory layer 54.

The backgate BG is formed on an insulating layer (not shown) on the semiconductor substrate 30. The backgate BG is formed to two-dimensionally spread. The backgate BG is formed by a conductive layer made of, e.g., polysilicon (poly-Si) in which an impurity (e.g., phosphorus) is doped.

The plurality of word lines WL are formed on the backgate BG with inter-electrode insulating layers being interposed between them. In other words, the plurality of inter-electrode insulating layers and the plurality of word lines WL are alternately stacked on the backgate BG. The word line WL is made of, e.g., poly-Si in which an impurity (e.g., boron) is doped, or a conductive layer such as a metal.

The selection gate SG is formed on an insulating layer (not shown) on the uppermost word line WL. Like the word line WL, the selection gate SG is made of impurity-doped poly-Si or a conductive layer such as a metal.

The source line SL is formed above the selection gate SG with an insulating layer (not shown) being interposed between them, and the bit lines BL are formed above the source line SL with an insulating layer (not shown) being interposed between them.

A U-shaped memory hole 58 is formed in the selection gate SG, word lines WL, backgate BG, and inter-electrode insulating layers. The U-shaped memory hole 58 includes a pair of through holes 56 juxtaposed in the column direction, and a connecting hole 57 for connecting the lower ends of the pair of through holes 56. The through holes 56 are formed to extend in the stacking direction in the selection gate SG, word lines WL, and inter-electrode insulating layers. The connecting hole 57 is formed to extend in the column direction in the backgate BG.

Also, a slit (not shown) expanding in the row direction and stacking direction between the pair of through holes 56 is formed in the word lines WL and inter-electrode insulating layers. This slit divides the word lines WL and inter-electrode insulating layers along the row direction. In addition, an opening (not shown) expanding in the row direction and stacking direction is formed in the selection gate SG above the slit so as to open it. This opening divides the selection gate SG along the row direction: one is the drain-side selection gate SGD, and the other is the source-side selection gate SGS. An insulating material or the like is buried in the slit and opening.

The memory layer 54 is formed on the inner surfaces of the U-shaped memory hole 58. That is, the memory layer 54 is formed on the selection gate SG, word lines WL, backgate BG, and inter-electrode insulating layers in the U-shaped memory hole 58. The memory layer 54 includes a block insulating layer 51, charge storage layer 52, and tunnel insulating layer 53 formed in this order on the inner surfaces of the U-shaped memory hole 58.

The U-shaped semiconductor layer 31 is formed on the memory layer 54 in the U-shaped memory hole 58. That is, the U-shaped semiconductor layer 31 includes a pair of pillar portions formed on the memory layer 54 in the pair of through holes 56, and a connecting portion formed on the memory layer 54 in the connecting hole 57. The U-shaped semiconductor layer 31 is formed by a conductive layer made of, e.g., poly-Si containing an impurity (e.g., phosphorus) or amorphous silicon (a-Si), and functions as a channel.

A core layer 55 is formed on the U-shaped semiconductor layer 31 in the U-shaped memory hole 58. The core layer 55 is formed by an insulating layer made of, e.g., silicon oxide (e.g., $SiO_2$), and filled in the U-shaped memory hole 58. Note that it is also possible to form a hollow instead of the core layer 55, and leave the U-shaped memory hole 58 unfilled.

Note also that although not shown, those portions of the selection gate SG and word lines WL, which are in contact with the insulating material (slit and opening), can also be silicidized.

The U-shaped semiconductor layer 31 and the memory layer 54 and various gates formed around the U-shaped semiconductor layer 31 form various transistors. The memory string 40 is formed along the U-shaped semiconductor layer 31 by using it as a channel.

More specifically, the word line WL, the U-shaped semiconductor layer 31, and the memory layer 54 formed between them form the memory cell transistor MTr. Also, the selection gates SG (the drain-side selection gate SGD and source-side selection gate SGS), the U-shaped semiconductor layer 31, and the memory layer 54 formed between them form the selection transistors (the drain-side selection transistor SDTr and source-side selection transistor SSTr).

Furthermore, the backgate BG, the U-shaped semiconductor layer 31, and the memory layer 54 formed between them form the backgate transistor BGTr. A voltage is applied to the backgate BG so that the backgate transistor BGTr is normally ON.

Note that in the selection transistors and backgate transistor BGTr, the memory layer 54 does not store data but simply functions as a gate insulating film regardless of its name "memory layer".

A set of the plurality of memory strings 40 arranged along the row direction in FIG. 5 corresponds to the memory group GP explained with reference to FIG. 5.

Figure 7:
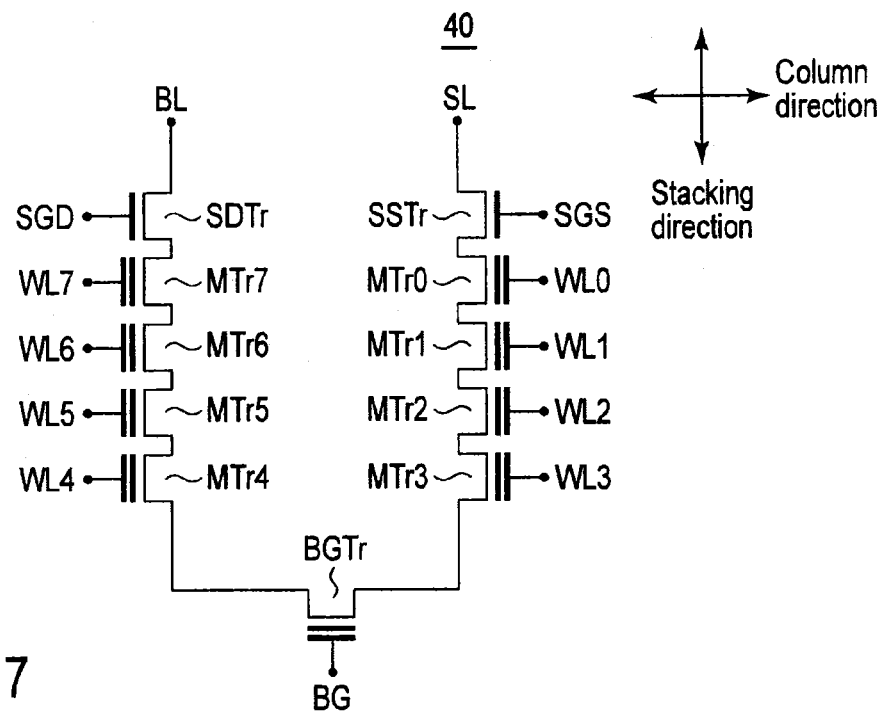
FIG. 7 is a circuit diagram of the memory string shown in FIG. 5.

FIG. 7 is a circuit diagram showing the memory string 40 shown in FIG. 5.

As shown in FIG. 7, the memory string 40 includes the source-side selection transistor SSTr, the drain-side selection transistor SDTr, memory cell transistors MTr0 to MTr7, and the backgate transistor BGTr.

As described previously, the current paths of the memory cell transistors MTr0 to MTr7 are connected in series between the source-side selection transistor SSTr and drain-side selection transistor SDTr. The current path of the backgate transistor BGTr is connected in series between the memory cell transistors MTr3 and MTr4.

More specifically, the current paths of the memory cell transistors MTr0 to MTr3 and the current paths of the memory cell transistors MTr4 to MTr7 are respectively connected in series in the stacking direction. These current paths are connected in series by the backgate transistor BGTr formed between the memory cell transistors MTr3 and MTr4 in the lower portion in the stacking direction. That is, the current paths of the source-side selection transistor SSTr, drain-side selection transistor SDTr, memory cell transistors MTr0 to MTr7, and backgate transistor BGTr are connected in series as the memory string 40 along the U-shaped silicon pillar shown in FIG. 6. In a data write operation and data read operation, the backgate transistor BGTr is normally ON.

Also, the control gates of the memory cell transistors MTr0 to MTr7 are connected to word lines WL0 to WL7, and the control gate of the backgate transistor BGTr is connected to the backgate BG. Furthermore, the gate of the source-side selection transistor SSTr is connected to the source-side selection gate SGS, and the gate of the drain-side selection transistor SDTr is connected to the drain-side selection gate SGD.

[Operation Method]

The operation method of the nonvolatile semiconductor memory device according to this embodiment will be explained below with reference to FIGS. 8 and 9. In the following description, the memory cell (memory cell transistor MTr) is an n-type channel transistor, and a multilevel operation of storing quaternary information by using one memory cell as two bits (by using four threshold levels) will be explained.

Figure 8:
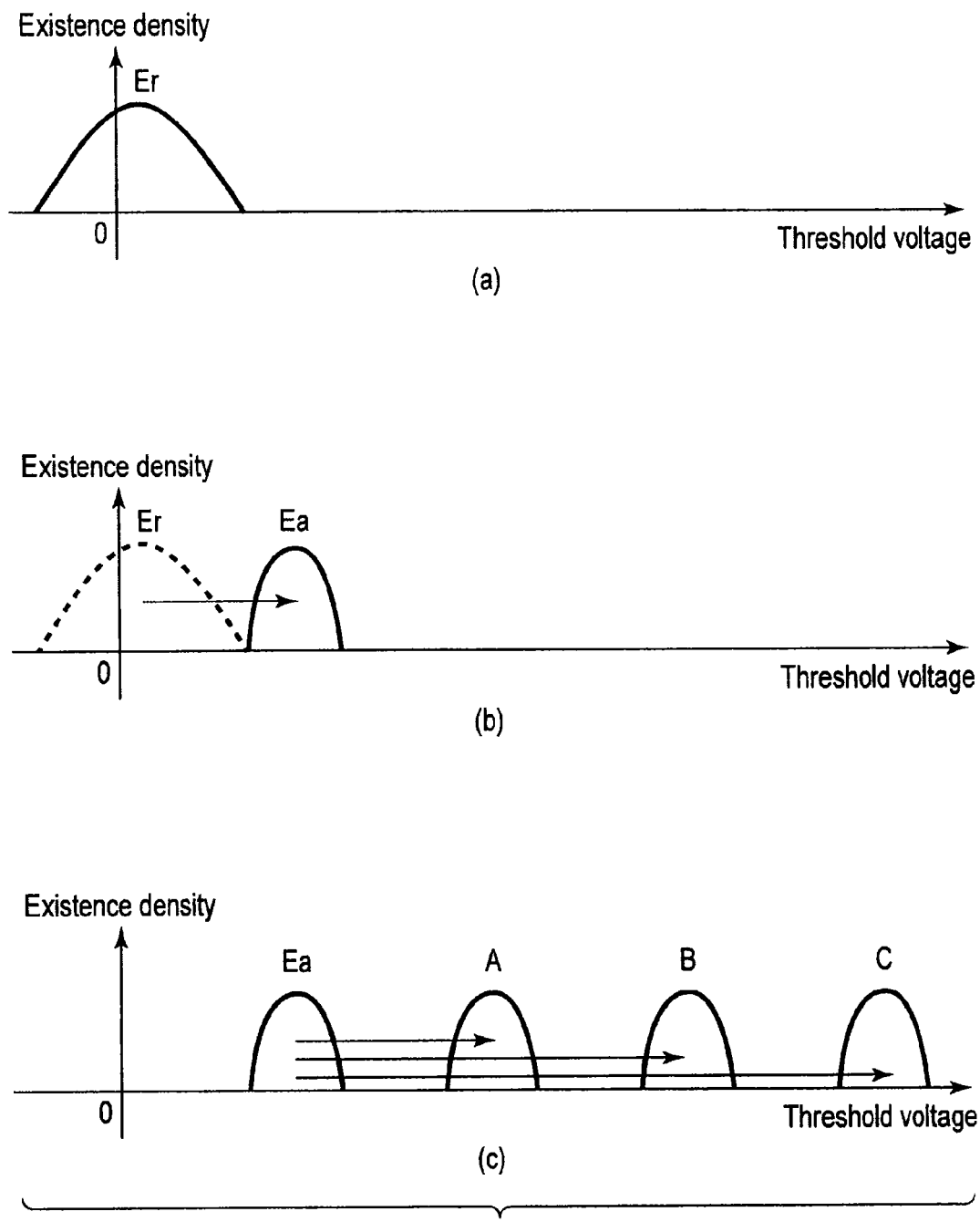
FIG. 8 shows views of memory cell threshold voltage distributions in a write/erase operation according to a comparative example with respect to the embodiment.

FIG. 8 shows views of memory cell threshold voltage distributions in a write/erase operation according to a comparative example with respect to this embodiment.

In this comparative example as shown in (a) of FIG. 8, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 8, the memory cell threshold level is shifted from the threshold level Er to a threshold level Ea. The threshold level Ea is a positive threshold level, and has a distribution narrower than that of the threshold level Er and equivalent to those of threshold levels A, B, and C (to be described later). The threshold level Ea is a base threshold level at which write is started, and is the lower-end (most negative) level of the four threshold levels.

Note that in the following explanation, a lower-end threshold level is a threshold level having the lowest voltage among a plurality of threshold levels. Also, an upper-end threshold level is a threshold level having the highest voltage among a plurality of threshold levels. Furthermore, the mth (m is a positive integer) threshold level from the lower end/upper end is the mth threshold level counted from the lower-end/upper-end threshold level as the first level.

Subsequently, as shown in (c) of FIG. 8, information is written to a write target memory cell. Consequently, the threshold level of the write target memory cell is shifted from the threshold level Ea to one of the threshold levels A, B, and C, or is not shifted. That is, the memory cell is written to four levels, i.e., the threshold levels Ea, A, B, and C in ascending order based on the threshold level Ea. In this step, practically no write operation is performed as write to the threshold level Ea.

In this method, threshold voltage differences between adjacent levels of the threshold levels Ea, A, B, and C are regarded as equal and 1 [unit]. In this case, an average threshold voltage shift amount (the average of threshold voltage shift amounts from the threshold level Ea to the threshold levels A, B, and C) in the write operation from the base threshold level Ea is (1+2+3)/3=2 [units]. As will be described in detail later, the charge retention characteristic deteriorates if the average threshold voltage shift amount in this write operation increases. By contrast, the embodiment decreases the average threshold voltage shift amount in this write operation.

Figure 9:
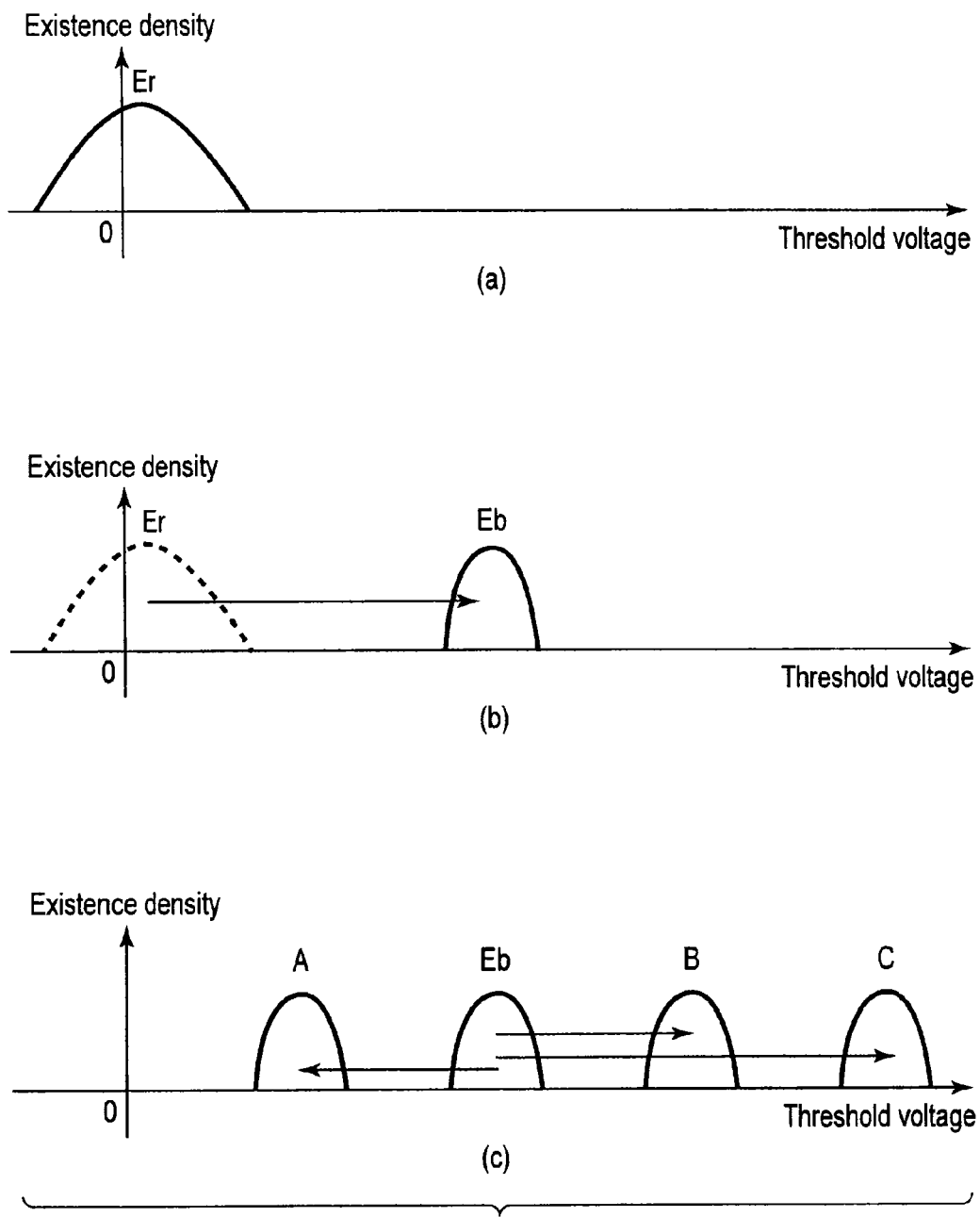
FIG. 9 shows views of memory cell threshold voltage distributions in a write/erase operation according to the embodiment.

FIG. 9 shows views of memory cell threshold voltage distributions in a write/erase operation according to this embodiment.

In this embodiment as shown in (a) of FIG. 9, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 9, the memory cell threshold level is shifted from the threshold level Er to a threshold level Eb. The threshold level Eb is a positive threshold level, and has a distribution narrower than that of the threshold level Er and equivalent to those of threshold levels A, B, and C (to be described later). The threshold level Eb is a base threshold level at which write is started, and is the second threshold level from the lower end (most negative side) of the four threshold levels. The threshold level Eb is equivalent to the threshold level A in the comparative example.

Subsequently, as shown in (c) of FIG. 9, information is written to a write target memory cell. Consequently, the threshold level of the write target memory cell is shifted from the threshold level Eb to one of the threshold levels A, B, and C, or is not shifted. That is, the memory cell is written to four levels, i.e., the threshold levels A, Eb, B, and C in ascending order based on the threshold level Eb. In this step, practically no write operation is performed as write to the threshold level Eb. Also, write to the threshold level A is practically the same as the erase operation. That is, write from the threshold level Eb to the threshold level A is equivalent to selectively performing the erase operation on the write target memory cell. This selective erase operation will be described in detail later.

In this method, threshold voltage differences between adjacent levels of the threshold levels A, Eb, B, and C are regarded as equal and 1 [unit]. In this case, an average threshold voltage shift amount in the write operation from the base threshold level Eb is (1+1+2)/3=1.33 [units].

As described above, the average threshold voltage shift amount in this embodiment is smaller than that in the comparative example, and smallest in the quaternary write operation. This makes it possible to suppress the deterioration of the tunnel insulating layer 53 caused by the repetition of the write/erase operation, thereby suppressing the deterioration of the charge retention characteristic. The amount of electric charge trapped in the tunnel insulating layer 53 is almost proportional to the threshold voltage shift amount. Therefore, the device lifetime of the memory cell resulting from the repetition of the write/erase operation in this embodiment is expected to be 2/1.33=1.5 times that in the comparative example.

Note that the base threshold level Eb is the second threshold level from the lower end (most negative side) of the four threshold levels, but is not limited to this. For example, the base threshold level Eb may also be the third threshold level from the lower end (most negative side) of the four threshold levels, i.e., may also be equivalent to the threshold level B in (c) of FIG. 9. In other words, the base threshold level Eb may also be a threshold level other than the two ends (lower and upper ends) of the four threshold levels. This makes it possible to minimize the average threshold voltage shift amount in the write operation.

In an n-type channel transistor in which the tunnel insulating layer 53 is made of silicon oxide, however, the rate of injection of holes to the tunnel insulating layer 53 is lower than that of electrons. In an n-type channel transistor, therefore, the operating speed of a selective erase operation performed by hole injection (a write operation from the positive side to the negative side) is lower than that of a write operation performed by electron injection (a write operation from the negative side to the positive side). As an example, the operating speed of a write operation from the base threshold level to the lower-end threshold level (first threshold level) when the base threshold level is the third threshold level from the lower end (most negative side) is lower than that of a write operation from the base threshold level to the upper-end threshold level (fourth threshold level) when the base threshold level is the second threshold level from the lower end (most negative side). In this embodiment, therefore, it is desirable to reduce the number of times of the selective erase operation performed by hole injection, and it is more desirable to set the base threshold level Eb at the second threshold level from the lower end (most negative side) of the four threshold levels.

[Selective Erase Operation Method]

The selective erase operation method of the nonvolatile semiconductor memory device according to this embodiment will be explained below with reference to FIGS. 10 and 11. This method will be explained by taking a structure in which memory strings are formed along I-shaped semiconductor layers as an example, but the same operation is possible in a structure in which memory strings are formed along U-shaped semiconductor layers.

As described above, the threshold voltage must be shifted in the negative direction from the base threshold level in the write operation method of the nonvolatile semiconductor memory device according to this embodiment. This operation is implemented by a so-called "selective erase operation" that selectively erases data from only one memory cell transistor MTr. Details of this selective erase operation will be explained below.

Figure 10:
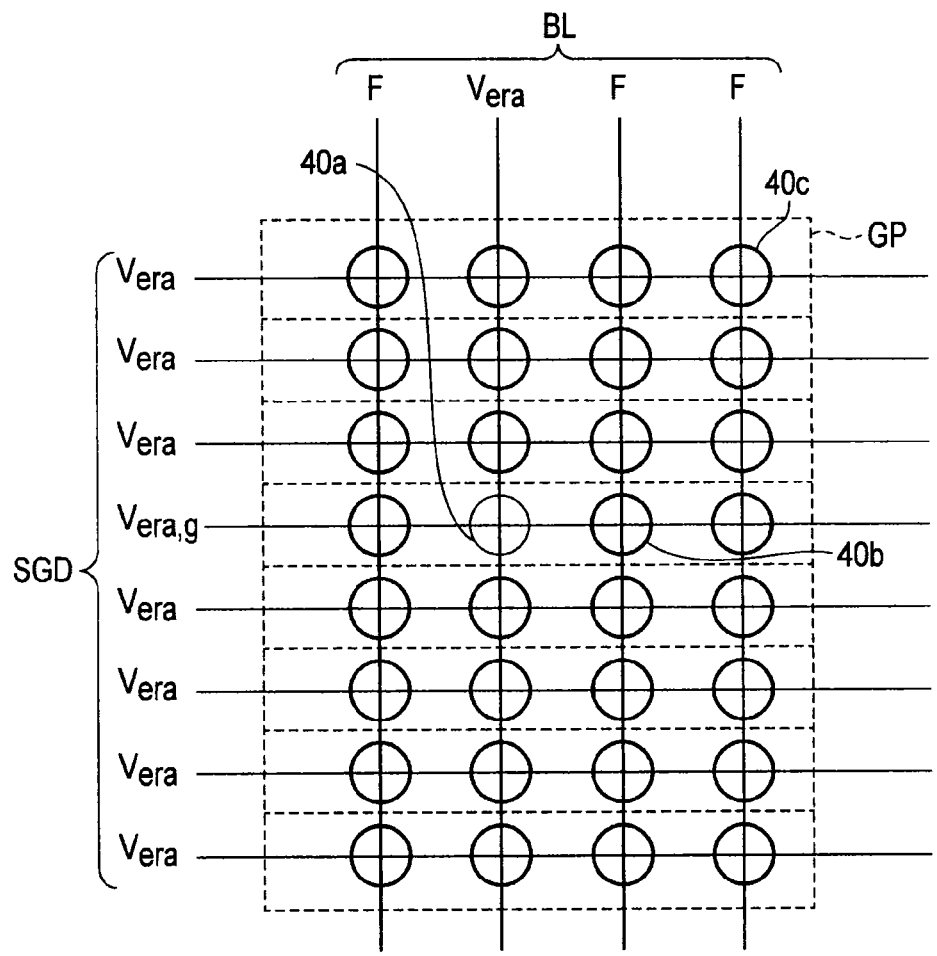
FIG. 10 is a schematic plan circuit diagram showing the nonvolatile semiconductor memory device according to the embodiment.

FIG. 10 is a schematic plan circuit view showing the nonvolatile semiconductor memory device according to the embodiment, and is a view showing the selective erase method of the memory strings 40. FIG. 11 is a schematic sectional circuit diagram showing the memory group GP including a selected memory string 40a shown in FIG. 10, and is a view showing the selective erase method of the memory cell transistors MTr.

First, voltages to be applied to the selected memory cell transistor MTr and to the selected memory string 40a including the selected memory cell transistor MTr will be explained with reference to FIGS. 10 and 11.

As shown in FIGS. 10 and 11, a voltage Vera,g is applied to the drain-side selection gate SGD of the selected memory string 40a. Also, a voltage Vera is applied to the bit line BL connected to the selected memory string 40a. That is, the voltage Vera,g is applied to the gate of the drain-side selection transistor SDTr, and the voltage Vera is applied to its drain. In this state, Vera>Vera,g. Since the abovementioned voltages are applied to the drain-side selection transistor SDTr, a GIDL (Gate-Induced Drain Leakage) occurs in the drain region of the drain-side selection transistor SDTr. Selective erase is performed by supplying hole current generated by the GIDL to the channel region of the selected memory string 40a, thereby supplying the current to the selected memory cell transistor MTr.

As shown in FIG. 11, to supply the hole current generated by the GIDL to the channel region of the selected memory string 40a and to the selected memory cell transistor MTr, a voltage Vpass is applied to the gate (word line WL) of an unselected memory cell transistor MTr in the selected memory string 40a, and a voltage Vpgm is applied to the gate (word line WL) of the selected memory cell transistor MTr. The voltage Vpass has a large value to such an extent that the hole current flows through the channel region, and the voltage Vpgm is, e.g., 0 V. Also, 0≤Vpgm≤Vpass≤Vera,g≤Vera holds. By thus regulating the voltages Vpass and Vpgm, it is possible to supply the hole current to the selected memory cell transistor MTr and selectively erase data from only the selected memory cell transistor MTr.

The hole current generated by the GIDL and supplied to the channel region of the selected memory string 40a flows through the selected memory cell transistor MTr and reaches the source-side selection transistor SSTr. However, the voltage Vera is applied to the source-side selection gate SGS in the selected memory string 40a, and is also applied to the source line SL connected to the selected memory string 40a. That is, the voltage Vera is applied to the gate and source of the source-side selection transistor SSTr. Accordingly, no GIDL occurs in the source-side selection transistor SSTr, so the transistor is cutoff. Therefore, the hole current stops in the source-side selection transistor SSTr.

Next, voltages to be applied to an unselected memory string 40b belonging to the same memory group GP as that of the selected memory string 40a will be explained with reference to FIGS. 10 and 11 again.

As shown in FIGS. 10 and 11, similar to the drain-side selection gate SGD of the selected memory string 40a, the voltage Vera,g is applied to the drain-side selection gate SGD of the unselected memory string 40b belonging to the same memory group GP as that of the selected memory string 40a. On the other hand, the bit line BL connected to the unselected memory string 40b floats. In this case, no GIDL occurs in the drain region of the drain-side selection gate SGD.

Also, similar to the source-side selection gate SGS of the selected memory string 40a, the voltage Vera is applied to the source-side selection gate SGS of the unselected memory string 40b belonging to the same memory group GP as that of the selected memory string 40a. The voltage Vera is also applied to the source line SL. Accordingly, no GIDL occurs in the source-side selection transistor SSTr, so the transistor is cutoff. In the unselected memory string 40b belonging to the same memory group GP as that of the selected memory string 40a, therefore, no erase operation progresses even when the voltage Vpgm is applied to the gate (word line WL) of the memory cell transistor MTr.

Voltages to be applied to an unselected memory string 40c belonging to a memory group GP different from that of the selected memory string 40a will be explained below with reference to FIG. 10 again.

As shown in FIG. 10, the voltage Vera is applied to the drain-side selection gate SGD of the unselected memory string 40c belonging to the memory group GP different from that of the selected memory string 40a. Also, either Vera is applied, similar to the selected memory string 40a, to the bit line BL connected to the unselected memory string 40c belonging to the memory group GP different from that of the selected memory string 40a, or the bit line BL floats. That is, the drain-side selection transistor SDTr is cutoff because either Vera is applied to the gate and drain, or Vera is applied to the gate and the drain floats. Accordingly, no GIDL occurs in the drain region of the drain-side selection transistor SDTr. Therefore, no erase operation progresses in the memory cell transistor MTr of the unselected memory string 40c belonging to the memory group GP different from that of the selected memory string 40a.

Thus, selective erase for only one memory cell transistor MTr can be executed.

[Effect]

In the abovementioned embodiment, in a memory cell for storing quaternary information, the base threshold level at which write is started is set at a nearly intermediate threshold level of a plurality of threshold levels. More specifically, the base threshold level at which write is started is set at the second threshold level from the lower end of four threshold levels. This can reduce the average threshold voltage shift amount when a write/erase operation is repeated. That is, it is possible to decrease an electric field to be applied to the tunnel insulating layer 53 in a write operation, thereby suppressing the deterioration of the tunnel insulating layer 53. Consequently, the deterioration of the charge retention characteristic can be suppressed.

The basis of the above effect will be explained below with reference to FIGS. 12 and 13.

Figure 12:
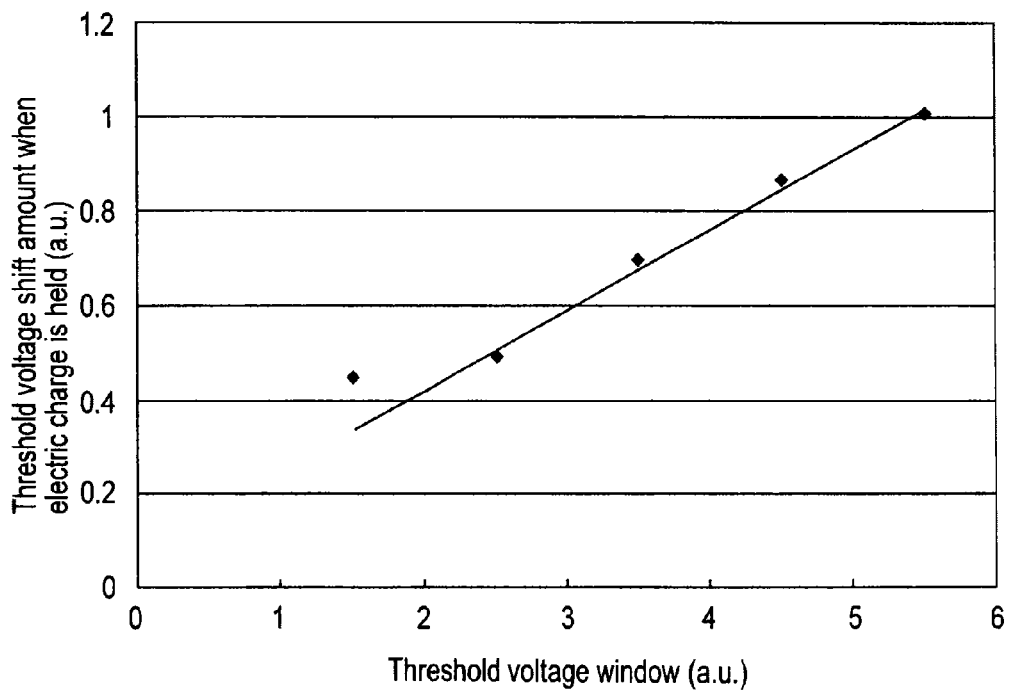
FIG. 12 is a graph of experimental results showing the relationship between a threshold voltage window in repetitive write/erase operations and a threshold voltage shift amount when electric charge is retained.

FIG. 12 is a graph of experimental results showing the relationship between a threshold voltage window in repetitive write/erase operations, and a threshold voltage shift amount when electric charge is retained.

The threshold voltage window indicates a threshold voltage shift amount (Vth,win) in a write operation. In other words, the threshold voltage window is the absolute value of the difference between a threshold level after write (a write threshold level Vth,w) and a threshold level before write (an erase threshold level Vth,e (e.g., the base threshold level)). Also, the threshold voltage shift amount when electric charge is retained indicates the amount of electric charge (electrons) released from the charge storage layer when a predetermined time has elapsed at a predetermined temperature after a write operation. When the amount of electric charge (electrons) from the charge storage layer is large, the charge retention characteristic deteriorates. That is, FIG. 12 shows experimental results indicating the charge retention characteristic as a function of the threshold voltage shift amount in a write operation.

As shown in FIG. 12, the threshold voltage window in repetitive write/erase operations and the threshold voltage shift amount when electric charge is retained have a proportional relationship: when the threshold voltage window in repetitive write/erase operations increases, the threshold voltage shift amount when electric charge is retained increases. That is, the deterioration of the charge retention characteristic can be suppressed by decreasing the threshold voltage window in repetitive write/erase operations as in this embodiment.

Figure 13:
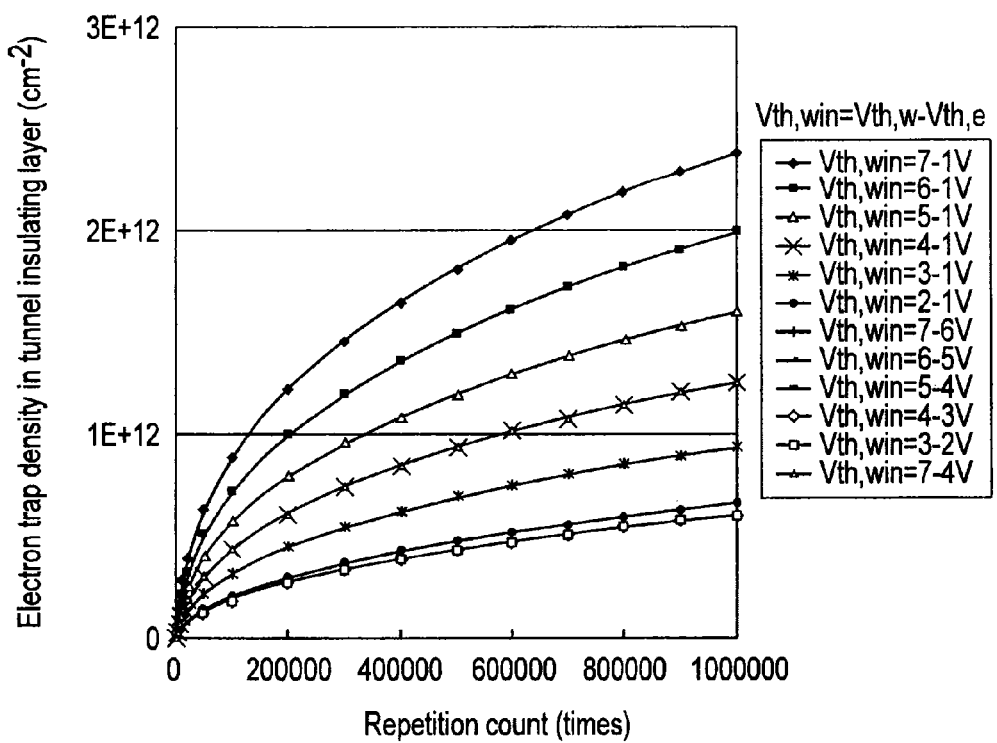
FIG. 13 is a simulation graph showing the relationship between the count of repetitive write/erase operations and the electron trap density in a tunnel insulating layer.

FIG. 13 is a simulation graph showing the relationship between the count of repetitive write/erase operations and the electron trap density in the tunnel insulating layer in each threshold voltage window Vth,win.

The threshold voltage window Vth,win (=Vth,w−Vth,e) was calculated for cases (1) to (3) below. (1) The erase threshold level Vth,e was fixed at 1 V, and the write threshold level Vth,w was changed from 2 to 7 V. (2) The erase threshold level Vth,e was changed from 2 to 6 V, and the threshold voltage window Vth,win was fixed at 1 V. (3) The threshold voltage window Vth,win was set at 3 V (Vth,w=7 V, Vth,e=4 V). Note that the efficiency of charge storage to the charge storage layer is 100% in this calculation, so the calculation is the same as that for write/erase of a floating gate type memory cell.

As shown in FIG. 13, when the repetitive write/erase operation count is increased in each threshold voltage window Vth,win, the electron trap density in the tunnel insulating layer increases. Also, the electron trap density in the tunnel insulating layer depends on the threshold voltage window Vth,win. More specifically, the electron trap density in the tunnel insulating layer increases as the threshold voltage window Vth,win increases, and decreases as the threshold voltage window Vth,win decreases. In addition, the electron trap density in the tunnel insulating layer linearly increases as the threshold voltage window Vth,win increases. In this state, the electron trap density in the tunnel insulating layer does not depend on the erase threshold level Vth,e and write threshold level Vth,w, and depends on only the difference between them, i.e., the threshold voltage window Vth,win.

Electrons once trapped in the tunnel insulating layer are emitted during a following electric charge retention and cause a threshold voltage shift, thereby affecting the deterioration of the charge retention characteristic. That is, the increase in electron trap density in the tunnel insulating layer leads to the deterioration of the charge retention characteristic. Accordingly, the simulation results shown in FIG. 13 is consistent with the tendency of the experimental results shown in FIG. 12, i.e., the tendency that the increase in threshold voltage window Vth,win deteriorates the charge retention characteristic.

These experimental results and simulation results demonstrate that reducing the threshold voltage shift amount (threshold voltage window) in repetitive write/erase operations makes it possible to decrease the electron trap density in the tunnel insulating layer by relaxing an electric field to be applied to the tunnel insulating layer, and suppress the deterioration of the charge retention characteristic. That is, the abovementioned effect can be obtained by reducing the average threshold voltage shift amount in a write operation as described in this embodiment.

Note that the above effect is particularly effective for a memory such as a three-dimensionally stacked memory formed by a deposition method and including a tunnel insulating layer in which defects (traps) are readily created, but the present embodiment is not limited to this. This embodiment is applicable to all memories capable of the selective erase operation described above.

Note also that when using Si as a channel material, the current amount of a GIDL is small, so an erase operation may be controlled by the hole supply rate. By contrast, SiGe can be used as the drain region of the drain-side selection transistor SGD. This makes it possible to decrease the bandgap in the drain region of the drain-side selection transistor SGD, and accelerate the occurrence of a GIDL.

Furthermore, this embodiment has been explained by taking a three-dimensionally stacked memory including memory cells having a MONOS structure as an example. However, the present embodiment is not limited to this, and also applicable to a three-dimensionally stacked memory including floating gate type memory cells.

The channel material is not limited to Si and may also be Ge or SiGe. In this case, either an n-type or p-type channel transistor is applicable as a memory cell.

[Modification 1]

Modification 1 of the nonvolatile semiconductor memory device according to this embodiment will be explained below with reference to FIGS. 14 and 15. Modification 1 is an example in which memory cells are n-type channel transistors, and octernary information is stored by using one memory cell as three bits (by using eight threshold levels).

Figure 14:
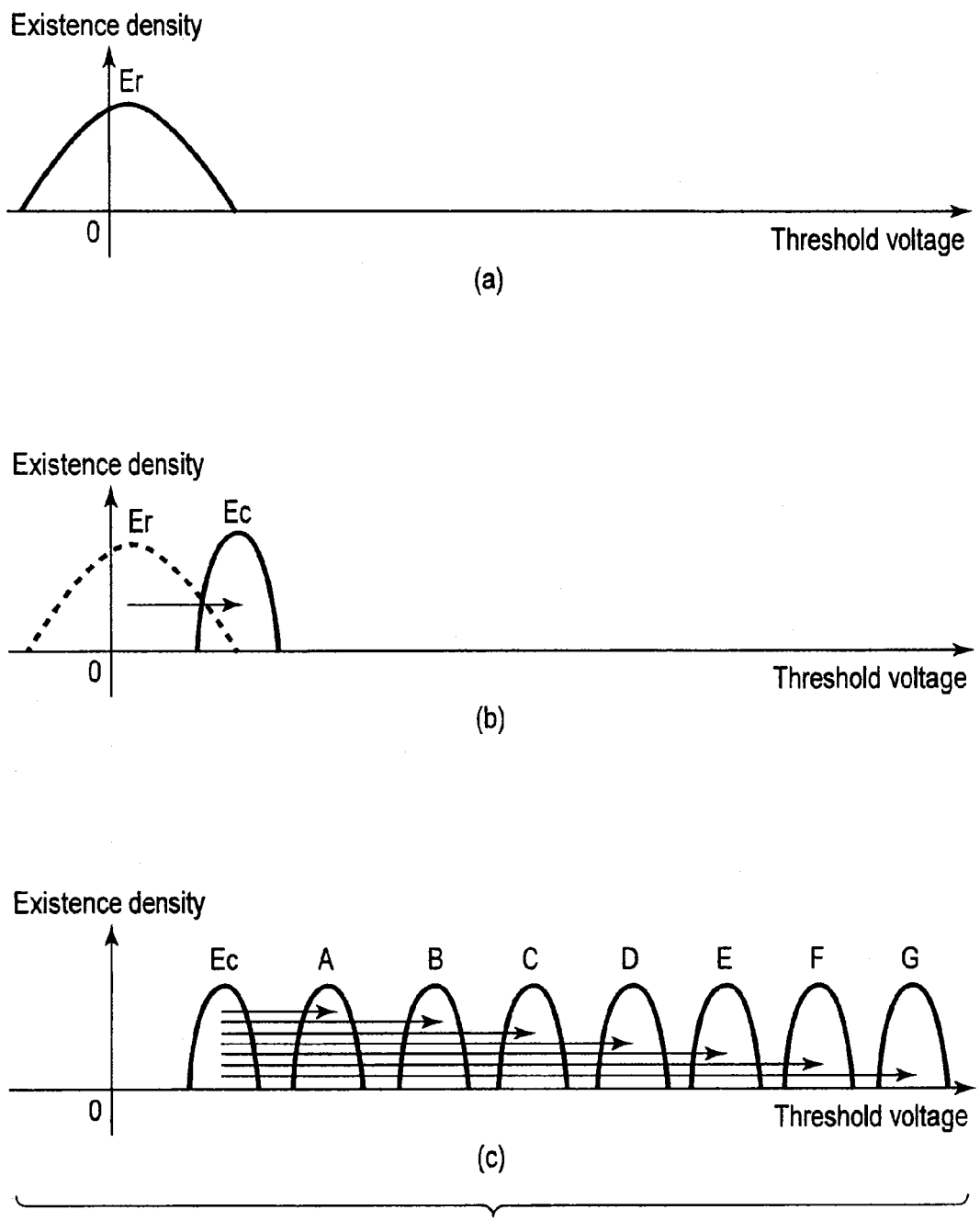
FIG. 14 shows views of memory cell threshold voltage distributions in a write/erase operation according to a comparative example with respect to Modification 1.

FIG. 14 shows views of memory cell threshold voltage distributions in a write/erase operation according to a comparative example with respect to Modification 1.

In this comparative example as shown in (a) of FIG. 14, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 14, the memory cell threshold level is shifted from the threshold level Er to a threshold level Ec. The threshold level Ec is a positive threshold level, and has a distribution narrower than that of the threshold level Er and equivalent to those of threshold levels A, B, C, D, E, F, and G (to be described later). The threshold level Ec is a base threshold level at which write is started, and is the lower-end (most negative) level of the eight threshold levels.

Subsequently, as shown in (c) of FIG. 14, information is written to a write target memory cell. Consequently, the threshold level of the write target memory cell is shifted from the threshold level Ec to one of the threshold levels A, B, C, D, E, F, and G, or is not shifted. That is, the memory cell is written to eight levels, i.e., the threshold levels Ec, A, B, C, D, E, F, and G in ascending order based on the threshold level Ec. In this step, practically no write operation is performed as write to the threshold level Ec.

In this method, threshold voltage differences between adjacent levels of the threshold levels Ec, A, B, C, D, E, F, and G are regarded as equal and 1 [unit]. In this case, an average threshold voltage shift amount (the average of threshold voltage shift amounts from the threshold level Ec to the threshold levels A, B, C, D, E, F, and G) in the write operation from the base threshold level Ec is $(1+2+3+4+5+6+7)/7=4$ [units].

Figure 15:
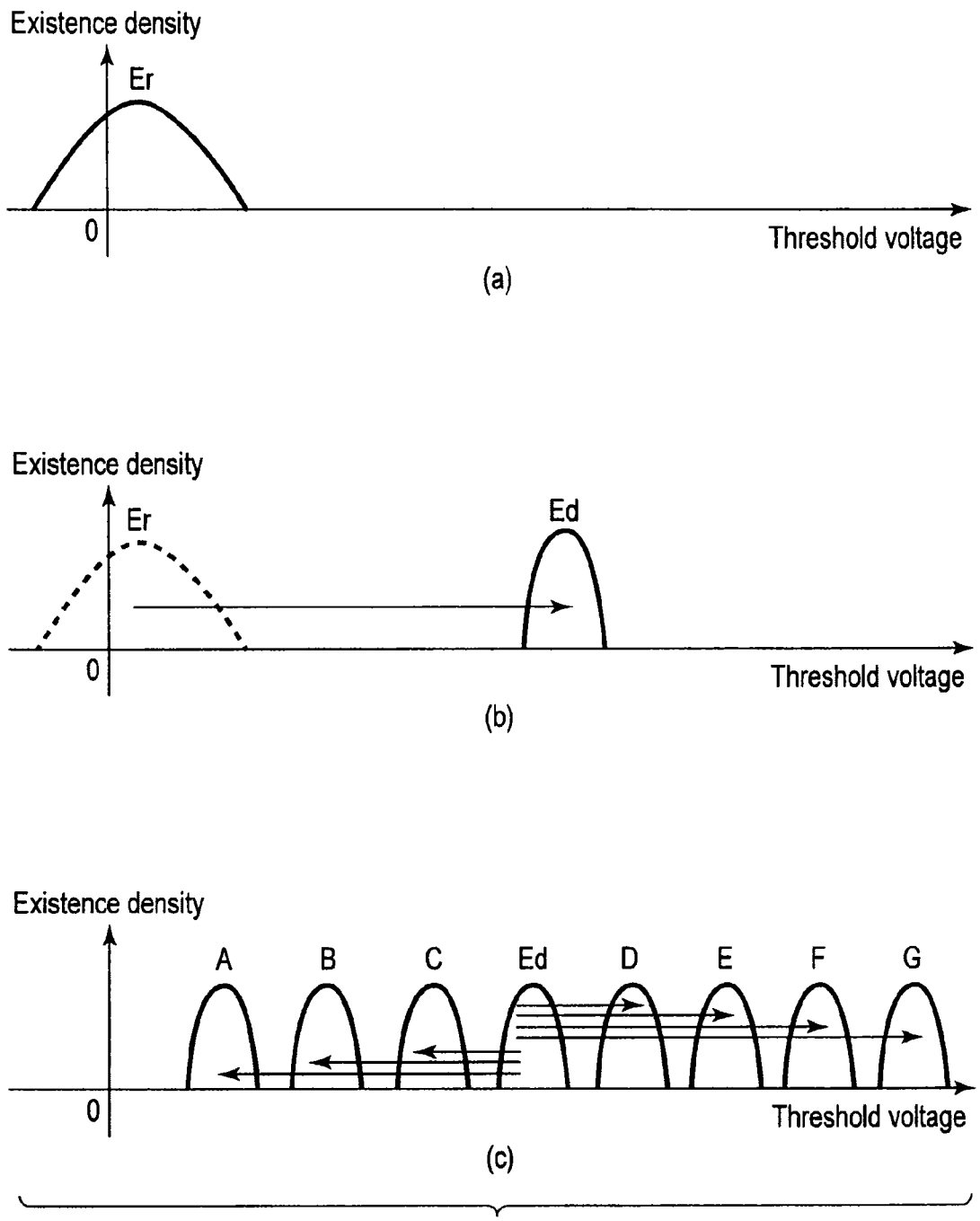
FIG. 15 shows views of memory cell threshold voltage distributions in a write/erase operation according to Modification 1.

FIG. 15 shows views of memory cell threshold voltage distributions in a write/erase operation according to Modification 1.

In Modification 1 as shown in (a) of FIG. 15, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 15, the memory cell threshold level is shifted from the threshold level Er to a threshold level Ed. The threshold level Ed is a positive threshold level, and has a distribution narrower than that of the threshold level Er and equivalent to those of threshold levels A, B, C, D, E, F, and G (to be described later). The threshold level Ed is a base threshold level at which write is started, and is the fourth threshold level from the lower end (most negative side) of the eight threshold levels. The threshold level Ed is equivalent to the threshold level C in the comparative example.

Subsequently, as shown in (c) of FIG. 15, information is written to a write target memory cell. Consequently, the threshold level of the write target memory cell is shifted from the threshold level Ed to one of the threshold levels A, B, C, D, E, F, and G, or is not shifted. That is, the memory cell is written to eight levels, i.e., the threshold levels A, B, C, Ed, D, E, F, and G in ascending order based on the threshold level Ed. In this step, practically no write operation is performed as write to the threshold level Ed. Also, write to the threshold levels A, B, and C is practically the same as the erase operation. That is, write from the threshold level Ed to the threshold levels A, B, and C is equivalent to selectively performing the erase operation on the write target memory cell.

In this method, threshold voltage differences between adjacent levels of the threshold levels A, B, C, Ed, D, E, F, and G are regarded as equal and 1 [unit]. In this case, an average threshold voltage shift amount in the write operation from the base threshold level Ed is (3+2+1+1+2+3+4)/7=2.29 [units].

As described above, the average threshold voltage shift amount in Modification 1 is smaller than that in the comparative example, and smallest in the octernary write operation. This makes it possible to suppress the deterioration of the tunnel insulating layer 53 caused by the repetition of the write/erase operation, thereby suppressing the deterioration of the charge retention characteristic. Also, the device lifetime of the memory cell resulting from the repetition of the write/erase operation in Modification 1 is expected to be 4/2.29=1.75 times that in the comparative example.

As indicated in the abovementioned embodiment and Modification 1, the effect of suppressing the deterioration of the tunnel insulating layer 53 remarkably appears when the number of bits of a memory cell is large. That is, as the number of bits of a memory cell increases, the device lifetime of the memory cell prolongs from that of the comparative example.

Note that the base threshold level Ed is the fourth threshold level from the lower end (most negative side) of the eight threshold levels, but is not limited to this. For example, the base threshold level Ed may also be the fifth threshold level from the lower end (most negative side) of the eight threshold levels, i.e., may also be equivalent to the threshold level D shown in (c) of FIG. 15. This makes it possible to minimize the average threshold voltage shift amount in the write operation. Alternatively, the base threshold level Ed may also be a threshold level other than the two ends (lower and upper ends) of the eight threshold levels. In Modification 1, however, it is more desirable to set the base threshold level Ed at the fourth threshold level from the lower end (most negative side) of the eight threshold levels.

Also, the memory cell operations described in the abovementioned embodiment and Modification 1 can similarly be implemented even in a multilevel operation in which one memory cell is used as four or more bits. For example, in a comparative example in which a memory cell is used for four bits (16 levels) (when the base threshold level is the lower-end threshold level of 16 threshold levels), the average threshold voltage shift amount when write/erase is repeated is (1+2+3+4+5+6+7+8+9+10+11+12+13+14+15)/15=8 [units]. By contrast, when the embodiment is applied to four bits (when the base threshold level is the eighth threshold level from the lower end of 16 threshold levels), the average threshold voltage shift amount is (7+6+5+4+3+2+1+1+2+3+4+5+6+7+8)/15=4.26 [units]. When using a memory cell for four bits, therefore, the device lifetime of the memory cell resulting from the repetition of a write/erase operation is expected to be 8/4.26=1.875 times that of the comparative example.

[Modification 2]

Modification 2 of the nonvolatile semiconductor memory device according to this embodiment will be explained below with reference to FIGS. 16 and 17.

In the abovementioned embodiment and Modification 1, examples in which poly-Si or a-Si is the channel material and memory cells are n-type channel transistors have been explained. In a three-dimensionally stacked memory in which a MONOS structure is formed by deposition, however, it is also possible to use Ge as the channel material in order to increase the carrier mobility in the channel region. When using Ge as the channel material, the contact resistance increases if memory cells are n-type channel transistors. Also, the conductivity type readily changes to p-type when a defect occurs in Ge.

By contrast, Modification 2 is an example in which Ge is used as the channel material and memory cells are p-type channel transistors. Modification 2 is also an example in which quaternary information is stored by using one memory cell as two bits (by using four threshold levels).

Figure 16:
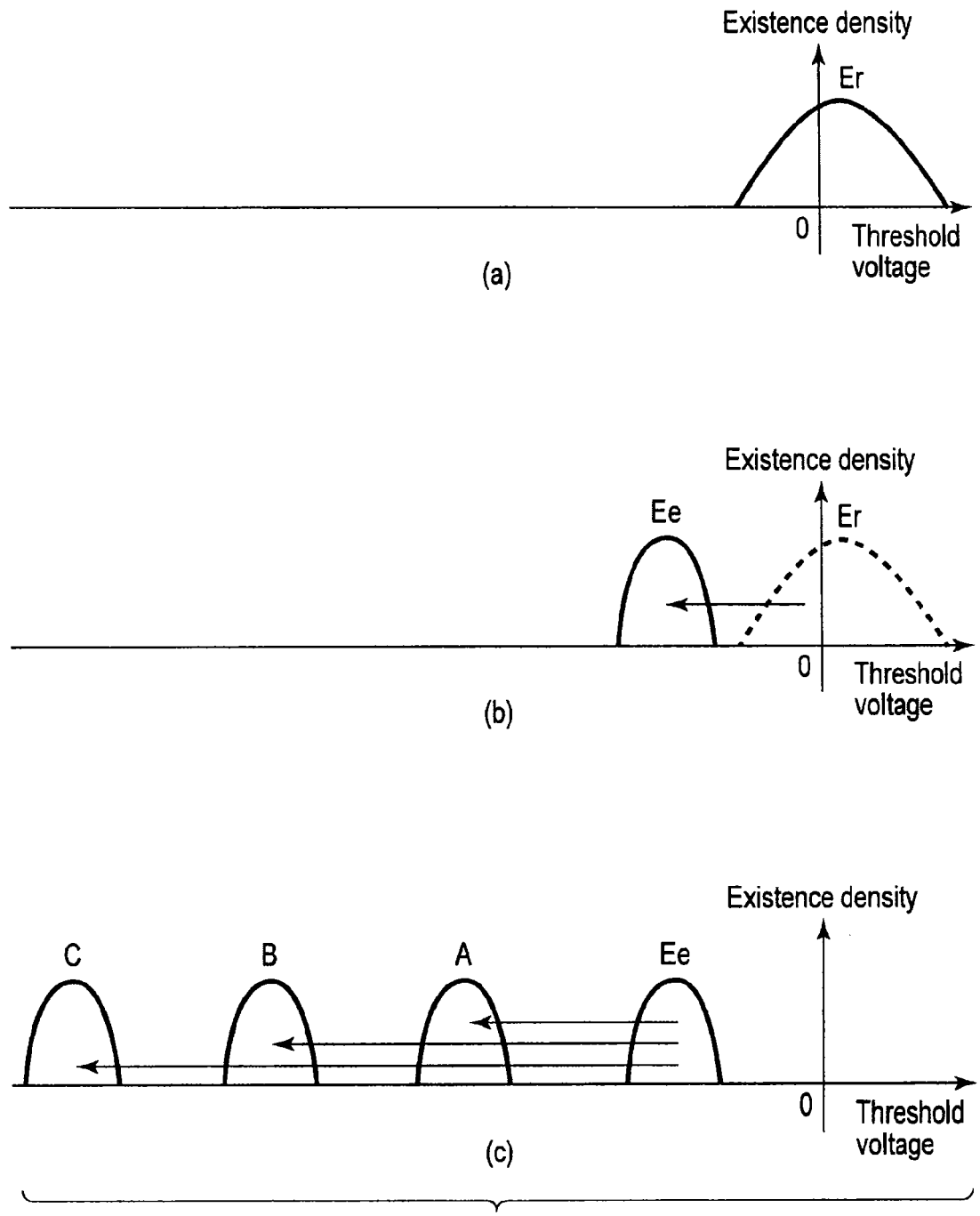
FIG. 16 shows views of memory cell threshold voltage distributions in a write/erase operation according to a comparative example with respect to Modification 2.

FIG. 16 shows views of memory cell threshold voltage distributions in a write/erase operation according to a comparative example with respect to Modification 2.

In this comparative example as shown in (a) of FIG. 16, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 16, the memory cell threshold level is shifted from the threshold level Er to a threshold level Ee. The threshold level Ee is a negative threshold level, and has a distribution narrower than that of the threshold level Er and equivalent to those of threshold levels A, B, and C (to be described later). The threshold level Ee is a base threshold level at which write is started, and is the upper-end (most positive) level of the four threshold levels.

Subsequently, as shown in (c) of FIG. 16, information is written to a write target memory cell. Consequently, the threshold level of the write target memory cell is shifted from the threshold level Ee to one of the threshold levels A, B, and C, or is not shifted. That is, the memory cell is written to four levels, i.e., the threshold levels Ee, A, B, and C in descending order based on the threshold level Ee. In this step, practically no write operation is performed as write to the threshold level Ee.

In this method, threshold voltage differences between adjacent levels of the threshold levels Ee, A, B, and C are regarded as equal and 1 [unit]. In this case, an average threshold voltage shift amount (the average of threshold voltage shift amounts from the threshold level Ee to the threshold levels A, B, and C) in the write operation from the base threshold level Ee is (1+2+3)/3=2 [units].

Figure 17:
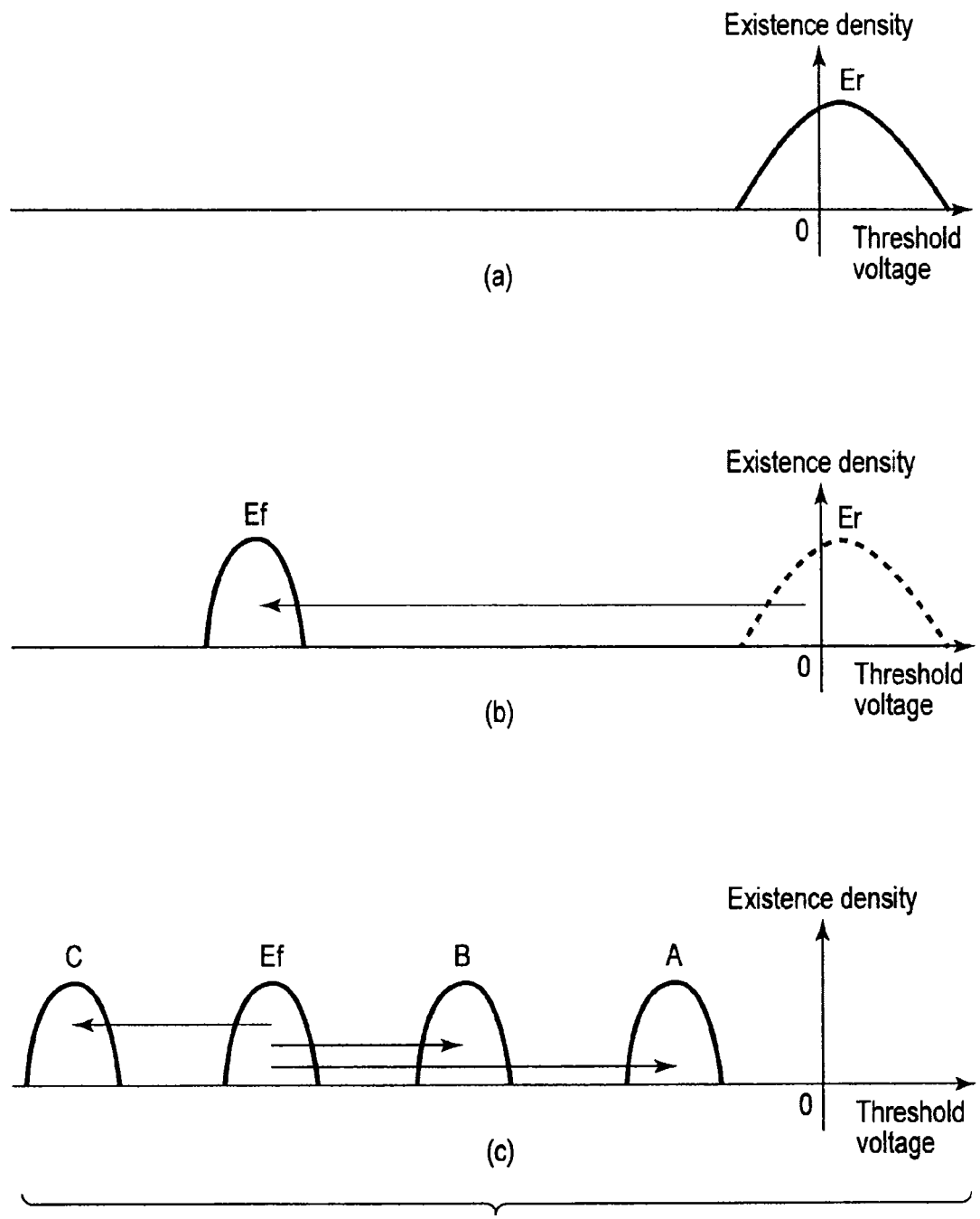
FIG. 17 shows views of memory cell threshold voltage distributions in a write/erase operation according to Modification 2.

FIG. 17 shows views of memory cell threshold voltage distributions in a write/erase operation according to Modification 2.

In Modification 2 as shown in (a) of FIG. 17, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 17, the memory cell threshold level is shifted from the threshold level Er to a threshold level Ef. The threshold level Ef is a negative threshold level, and has a distribution narrower than that of the threshold level Er and equivalent to those of threshold levels A, B, and C (to be described later). The threshold level Ef is a base threshold level at which write is started, and is the third threshold level from the upper end (most positive side) of the four threshold levels. The threshold level Ef is equivalent to the threshold level B in the comparative example.

Subsequently, as shown in (c) of FIG. 17, information is written to a write target memory cell. Consequently, the threshold level of the write target memory cell is shifted from the threshold level Ef to one of the threshold levels A, B, and C, or is not shifted. That is, the memory cell is written to four levels, i.e., the threshold levels, A, B, Ef, and C in descending order based on the threshold level Ef. In this step, practically no write operation is performed as write to the threshold level Ef. Also, write to the threshold levels A and B is practically the same as the erase operation. That is, write from the threshold level Ef to the threshold levels A and B is equivalent to selectively performing the erase operation on the write target memory cell.

In this method, threshold voltage differences between adjacent levels of the threshold levels A, B, Ef, and C are regarded as equal and 1 [unit]. In this case, an average threshold voltage shift amount in the write operation from the base threshold level Ef is $(1+1+2)/3=1.33$ [units].

As described above, the average threshold voltage shift amount in this embodiment is smaller than that in the comparative example, and smallest in the quaternary write operation. This makes it possible to suppress the deterioration of the tunnel insulating layer 53 caused by the repetition of the write/erase operation, thereby suppressing the deterioration of the charge retention characteristic. Also, the device lifetime of the memory cell resulting from the repetition of the write/erase operation in Modification 2 is expected to be $2/1.33=1.5$ times that in the comparative example.

Note that the base threshold level Ef is the third threshold level from the upper end (most positive side) of the four threshold levels, but is not limited to this. For example, the base threshold level Ef may also be the second threshold level from the upper end (most positive side) of the four threshold levels, i.e., may also be equivalent to the threshold level B shown in (c) of FIG. 17. In other words, the base threshold level Ef may also be a threshold level other than the two ends (lower and upper ends) of the four threshold levels. This makes it possible to minimize the average threshold voltage shift amount in the write operation.

However, the rate of injection of electrons to the tunnel insulating layer 53 is higher than that of holes in a p-type channel transistor as well. In a p-type channel transistor, therefore, the operating speed of a selective erase operation performed by electron injection (a write operation from the negative side to the positive side) is higher than that of a write operation performed by hole injection (a write operation from the positive side to the negative side). As an example, the operating speed of a selective erase operation from the base threshold level to the upper-end threshold level (first threshold level) when the base threshold level is the third threshold level from the upper end (most positive side) is higher than that of a write operation from the base threshold level to the lower-end threshold level (fourth threshold level) when the base threshold level is the second threshold level from the upper end (most positive side). In Modification 2, therefore, it is desirable to reduce the number of times of the write operation performed by hole injection (the write operation from the positive side to the negative side), and it is more desirable to set the base threshold level Ef at the third threshold level from the upper end (most positive side) of the four threshold levels.

In a p-type channel transistor using Ge as a channel, holes generally function as carriers in a write operation. However, the speed of a write operation using holes is relatively low because the band offset of the valence band is large in the tunnel insulating layer 53 made of $SiO_2$. By contrast, a selective erase operation using electrons as carriers (a write operation from the negative side to the positive side) is partially performed in Modification 2. Therefore, the average operating speed of a write operation using electrons as carriers as well (a write operation using the selective erase operation using electrons as well) in Modification 2 can be made higher than that of the write operation using only holes as carriers in the comparative example.

Note that the selective erase operation (the write operation from the negative side to the positive side) in Modification 2 can be implemented by inverting the positive/negative sign of each voltage in the selective erase operation (the write operation from the positive side to the negative side) shown in FIGS. 10 and 11 of the abovementioned embodiment.

[Modification 3]

Modification 3 of the nonvolatile semiconductor memory device according to this embodiment will be explained below with reference to FIGS. 18 and 19. Modification 3 is an example in which memory cells are p-type channel transistors, and octernary information is stored by using one memory cell as three bits (by using eight threshold levels).

Figure 18:
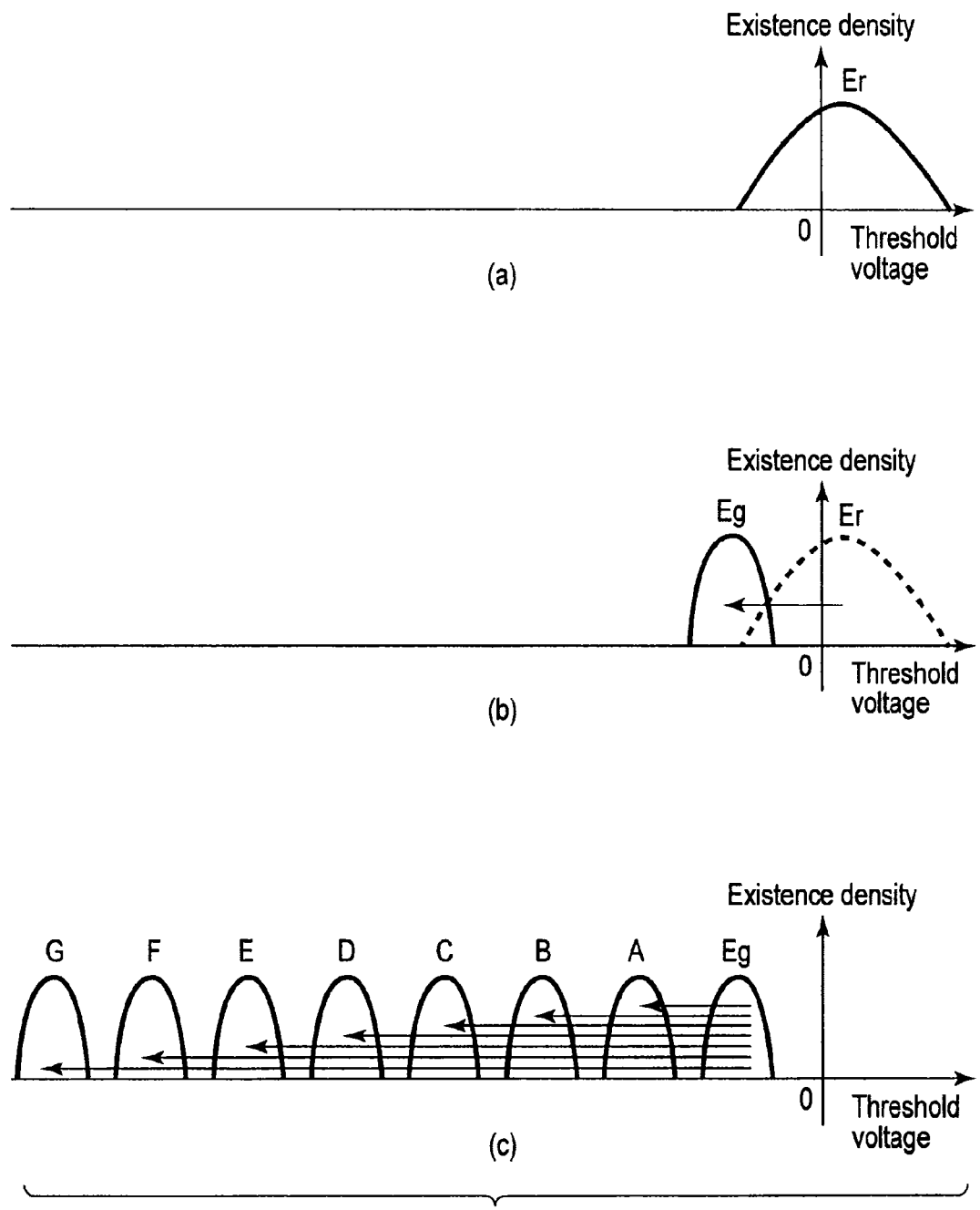
FIG. 18 shows views of memory cell threshold voltage distributions in a write/erase operation according to a comparative example with respect to Modification 3.

FIG. 18 shows views of memory cell threshold voltage distributions in a write/erase operation according to a comparative example with respect to Modification 3.

In this comparative example as shown in (a) of FIG. 18, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 18, the memory cell threshold level is shifted from the threshold level Er to a threshold level Eg. The threshold level Eg is a negative threshold level, and has a distribution narrower than that of the threshold level Er and equivalent to those of threshold levels A, B, C, D, E, F, and G (to be described later). The threshold level Eg is a base threshold level at which write is started, and is the upper-end (most positive) level of the eight threshold levels.

Subsequently, as shown in (c) of FIG. 18, information is written to a write target memory cell. Consequently, the threshold level of the write target memory cell is shifted from the threshold level Eg to one of the threshold levels A, B, C, D, E, F, and G, or is not shifted. That is, the memory cell is written to eight levels, i.e., the threshold levels Eg, A, B, C, E, F, and G in descending order based on the threshold level Eg. In this step, practically no write operation is performed as write to the threshold level Eg.

In this method, threshold voltage differences between adjacent levels of the threshold levels Eg, A, B, C, D, E, F, and G are regarded as equal and 1 [unit]. In this case, an average threshold voltage shift amount (the average of threshold voltage shift amounts from the threshold level Eg to the threshold levels A, B, C, D, E, F, and G) in the write operation from the base threshold level Eg is $(1+2+3+4+5+6+7)/7=4$ [units].

Figure 19:
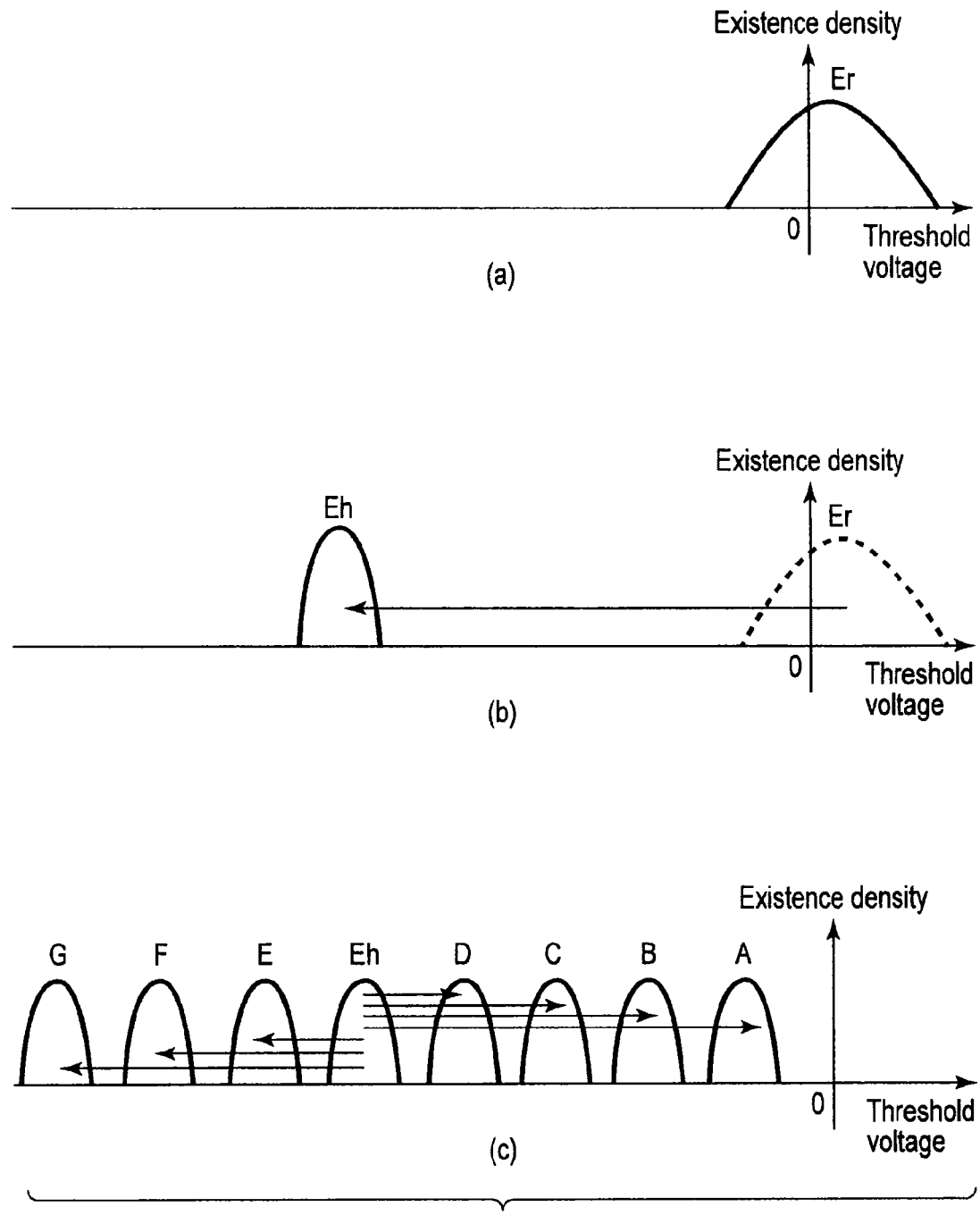
FIG. 19 shows views of memory cell threshold voltage distributions in a write/erase operation according to Modification 3.

FIG. 19 shows views of memory cell threshold voltage distributions in a write/erase operation according to Modification 3.

In Modification 3 as shown in (a) of FIG. 19, pieces of information in a plurality of memory cells are first collectively erased. By this erase operation, the memory cell threshold level is set at a threshold level Er. The threshold level Er is a positive or negative threshold level, and has a relatively wide distribution.

Then, as shown in (b) of FIG. 19, the memory cell threshold level is shifted from the threshold level Er to a threshold level Eh. The threshold level Eh is a negative threshold level, and has a distribution narrower than that of the threshold level Er and equivalent to those of threshold levels A, B, C, D, E, F, and G (to be described later). The threshold level Eh is a base threshold level at which write is started, and is the fifth threshold level from the upper end (most positive side) of the eight threshold levels. The threshold level Eh is equivalent to the threshold level D in the comparative example.

Subsequently, as shown in (c) of FIG. 19, information is written to a write target memory cell. Consequently, the threshold level of the write target memory cell is shifted from the threshold level Eh to one of the threshold levels A, B, C, D, E, F, and G, or is not shifted. That is, the memory cell is written to eight levels, i.e., the threshold levels A, B, C, D, Eh, E, F, and G in descending order based on the threshold level Eh. In this step, practically no write operation is performed as write to the threshold level Eh. Also, write to the threshold levels A, B, C, and D is practically the same as the erase operation. That is, write from the threshold level Eh to the threshold levels A, B, C, and D is equivalent to selectively performing the erase operation on the write target memory cell.

In this method, threshold voltage differences between adjacent levels of the threshold levels A, B, C, D, Eh, E, F, and G are regarded as equal and 1 [unit]. In this case, an average threshold voltage shift amount in the write operation from the base threshold level Eh is (3+2+1+1+2+3+4)/7=2.29 [units].

As described above, the average threshold voltage shift amount in Modification 3 is smaller than that in the comparative example, and smallest in the octernary write operation. This makes it possible to suppress the deterioration of the tunnel insulating layer 53 caused by the repetition of the write/erase operation, thereby suppressing the deterioration of the charge retention characteristic. Also, the device lifetime of the memory cell resulting from the repetition of the write/erase operation in Modification 3 is expected to be 4/2.29=1.75 times that in the comparative example.

Note that the base threshold level Eh is the fifth threshold level from the upper end (most positive side) of the eight threshold levels, but is not limited to this. For example, the base threshold level Eh may also be the fourth threshold level from the upper end (most positive side) of the eight threshold levels, i.e., may also be equivalent to the threshold level D shown in (c) of FIG. 19. This makes it possible to minimize the average threshold voltage shift amount in the write operation. Alternatively, the base threshold level Eh may also be a threshold level other than the two ends (lower and upper ends) of the eight threshold levels. In Modification 3, however, it is more desirable to set the base threshold level Eh at the fifth threshold level from the upper end (most positive side) of the eight threshold levels.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array including memory cell transistors configured to store information in accordance with n (n is an integer larger than 2) threshold voltage levels; and
    a control circuit configured to control the memory cell array,
    wherein in a write operation, the control circuit shifts a threshold voltage level of a write target memory cell transistor to a base threshold level of the n threshold levels, except for a threshold level having a highest voltage and a threshold level having a lowest voltage, and then shifts the threshold level of the write target memory cell transistor from the base threshold level to one of the n threshold levels.

2. The nonvolatile semiconductor memory device of claim 1, wherein the base threshold level is a threshold level which minimizes an average threshold voltage shift amount when the threshold voltage level of the write target memory cell transistor is shifted from the base threshold level to one of the n threshold levels.

3. The nonvolatile semiconductor memory device of claim 1, wherein
    the memory cell transistors are n-type channel transistors, and store information in accordance with four threshold voltage levels, and
    the base threshold level is a second threshold level from the threshold level having a lowest voltage of the four threshold levels.

4. The nonvolatile semiconductor memory device of claim 3, wherein a channel material of the memory cell transistors contains Si.

5. The nonvolatile semiconductor memory device of claim 1, wherein
    the memory cell transistors are n-type channel transistors, and store information in accordance with eight threshold voltage levels, and
    the base threshold level is a fourth threshold level from the threshold level having a lowest voltage of the eight threshold levels.

6. The nonvolatile semiconductor memory device of claim 5, wherein a channel material of the memory cell transistors contains Si.

7. The nonvolatile semiconductor memory device of claim 1, wherein
    the memory cell transistors are p-type channel transistors, and store information in accordance with four threshold voltage levels, and
    the base threshold level is a third threshold level from the threshold level having a highest (most positive) voltage of the four threshold levels.

8. The nonvolatile semiconductor memory device of claim 7, wherein a channel material of the memory cell transistors contains Ge.

9. The nonvolatile semiconductor memory device of claim 1, wherein
    the memory cell transistors are p-type channel transistors, and store information in accordance with eight threshold voltage levels, and
    the base threshold level is a fifth threshold level from the threshold level having a highest (most positive) voltage of the eight threshold levels.

10. The nonvolatile semiconductor memory device of claim 9, wherein a channel material of the memory cell transistors contains Ge.

11. The nonvolatile semiconductor memory device of claim 1, wherein the memory cell transistors comprise:
    an inter-electrode insulating layers and word lines alternately stacked above a semiconductor substrate;
    a block insulating layer formed on an inner surface of a memory hole extending through the inter-electrode insulating layers and the word lines;
    a charge storage layer formed on the block insulating layer;
    a tunnel insulating layer formed on the charge storage layer; and
    a semiconductor layer formed on the tunnel insulating layer.

12. The nonvolatile semiconductor memory device of claim 1, wherein the memory cell transistors comprise:

a backgate formed above a semiconductor substrate, and inter-electrode insulating layers and word lines alternately stacked above the backgate;

a block insulating layer formed on inner surfaces of a pair of through holes formed in the inter-electrode insulating layers and the word lines, and extending in a stacking direction, and on an inner surface of a connecting hole which is formed in the backgate and connects lower ends of the pair of through holes;

a charge storage layer formed on the block insulating layer;

a tunnel insulating layer formed on the charge storage layer; and a semiconductor layer formed on the tunnel insulating layer.

13. A nonvolatile semiconductor memory device comprising:

a memory cell array containing a memory string including memory cell transistors configured to store information in accordance with n (n is an integer larger than 2) threshold voltage levels and configured to have current paths connected in series;

a drain-side selection transistor including a current path having one end connected to one end of a current path of the memory string, and the other end connected to a bit line;

a source-side selection transistor including a current path having one end connected to the other end of the current path of the memory string, and the other end connected to a source line; and a control circuit configured to control the memory cell array, the drain-side selection transistor, and the source-side selection transistor, wherein in a write operation, the control circuit shifts a threshold voltage level of a write target memory cell transistor to a base threshold level of the n threshold levels, except for a threshold level having a highest voltage and a threshold level having a lowest voltage, and then shifts the threshold voltage level of the write target memory cell transistor from the base threshold level to one of the n threshold levels, and when shifting the threshold voltage level of the write target memory cell transistor from the base threshold level to a threshold level lower than the base threshold level or to a threshold level higher than the base threshold level, the control circuit supplies a GIDL (Gate-Induced Drain Leakage) current generated by a potential difference between the bit line and a gate of the drain-side selection transistor to the write target memory cell transistor.

14. The nonvolatile semiconductor memory device of claim 13, wherein the base threshold level is a threshold voltage level which minimizes an average threshold voltage shift amount when the threshold level of the write target memory cell transistor is shifted from the base threshold level to one of the n threshold levels.

15. The nonvolatile semiconductor memory device of claim 13, wherein the memory cell transistors are n-type channel transistors, and store information in accordance with four threshold voltage levels, the base threshold level is a second threshold level from the threshold level having a lowest voltage of the four threshold levels, and when shifting the threshold voltage level of the write target memory cell transistor from the base threshold level to a threshold level lower than the base threshold level, the control circuit supplies the GIDL current to the write target memory cell transistor.

16. The nonvolatile semiconductor memory device of claim 15, wherein a channel material of the memory cell transistors contains Si.

17. The nonvolatile semiconductor memory device of claim 13, wherein the memory cell transistors are p-type channel transistors, and store information in accordance with eight threshold levels, the base threshold level is a third threshold level from the threshold level having a highest (most positive) voltage of the four threshold levels, and when shifting the threshold voltage level of the write target memory cell transistor from the base threshold level to a threshold level higher (more positive) than the base threshold level, the control circuit supplies the GIDL current to the write target memory cell transistor.

18. The nonvolatile semiconductor memory device of claim 17, wherein a channel material of the memory cell transistors contains Ge.

19. The nonvolatile semiconductor memory device of claim 13, wherein the memory string comprises:

an inter-electrode insulating layers and word lines alternately stacked above a semiconductor substrate;

a block insulating layer formed on an inner surface of a memory hole extending through the plurality of inter-electrode insulating layers and the plurality of word lines;

a charge storage layer formed on the block insulating layer;

a tunnel insulating layer formed on the charge storage layer; and a semiconductor layer formed on the tunnel insulating layer.

20. The nonvolatile semiconductor memory device of claim 13, wherein the memory string comprises:

a backgate formed above a semiconductor substrate, and an inter-electrode insulating layers and word lines alternately stacked above the backgate;

a block insulating layer formed on inner surfaces of a pair of through holes formed in the inter-electrode insulating layers and the word lines, and extending in a stacking direction, and on an inner surface of a connecting hole which is formed in the backgate and connects lower ends of the pair of through holes;

a charge storage layer formed on the block insulating layer;

a tunnel insulating layer formed on the charge storage layer; and a semiconductor layer formed on the tunnel insulating layer.

* * * * *